(12) United States Patent
Hsueh

(10) Patent No.: US 12,113,127 B2
(45) Date of Patent: Oct. 8, 2024

(54) GaN-BASED HIGH ELECTRON MOBILITY TRANSISTORS AND FABRICATION METHOD THEREOF

(71) Applicant: Nanjing Greenchip Semiconductor Co., Ltd., Nanjing (CN)

(72) Inventor: Kuang-Po Hsueh, Nanjing (CN)

(73) Assignee: Nanjing Greenchip Semiconductor Co., Ltd., Nanjing (CN)

( * ) Notice: Subject to any disclaimer, the term of this patent is extended or adjusted under 35 U.S.C. 154(b) by 398 days.

(21) Appl. No.: 17/719,393

(22) Filed: Apr. 13, 2022

(65) Prior Publication Data

US 2023/0268431 A1 Aug. 24, 2023

(30) Foreign Application Priority Data

Feb. 21, 2022 (CN) .......................... 202210155060.5

(51) Int. Cl.
| | |
|---|---|
| *H01L 29/778* | (2006.01) |
| *H01L 23/522* | (2006.01) |
| *H01L 23/528* | (2006.01) |
| *H01L 29/20* | (2006.01) |
| *H01L 29/66* | (2006.01) |

(52) U.S. Cl.
CPC ...... *H01L 29/7786* (2013.01); *H01L 23/5226* (2013.01); *H01L 23/5283* (2013.01); *H01L 29/2003* (2013.01); *H01L 29/66462* (2013.01)

(58) Field of Classification Search
CPC . H01L 23/522; H01L 23/528; H01L 23/5226; H01L 23/5283; H01L 21/768; H01L 21/76877; H01L 29/10; H01L 29/20; H01L 29/66; H01L 29/417; H01L 29/778; H01L 29/7786; H01L 29/1066; H01L 29/2003; H01L 29/4175; H01L 29/41758; H01L 29/66431; H01L 29/66462
USPC .................................................. 257/183, 194
See application file for complete search history.

(56) References Cited

U.S. PATENT DOCUMENTS

| | | | |
|---|---|---|---|
| 2023/0207557 A1* | 6/2023 | Carlson ............... | H01L 21/8258 257/76 |
| 2023/0261054 A1* | 8/2023 | Bothe ................. | H01L 29/7786 438/172 |
| 2023/0395695 A1* | 12/2023 | Hardiman ......... | H01L 29/42316 |

* cited by examiner

*Primary Examiner* — Chuong A Luu
(74) *Attorney, Agent, or Firm* — Chih Feng Yeh; Yongjean Consulting Inc.

(57) ABSTRACT

A process integration method for connecting the electrode of the normally-off or normally-on GaN-based HEMT to the backside electrode by a deep etching process. Among the three electrodes of each HEMT, a single electrode or multiple electrodes can be connected to the backside electrode. The electrodes to be connected to the backside electrode through an additional deep etching process. Therefore, there is no need to place PADs on various positions as wire bonding electrodes on the upper layer of device, which can reduce the area of the device layout and use the back metal to connect the package frame base island to reduce the wire bonding parasitic effect. A new structure proposed is a design of connecting the electrode and the backside electrode of the normally-off or normally-on GaN-based HEMTs. This process integration technology not only reduce the layout area, but also reduce the parasitic effect of the packaging.

16 Claims, 22 Drawing Sheets

GaN-BASED HIGH ELECTRON MOBILITY TRANSISTORS AND FABRICATION METHOD THEREOF

CROSS-REFERENCE STATEMENT

The present application is based on, and claims priority from, China Patent Application Serial Number 202210155060.5, filed Feb. 21, 2022, the disclosure of which is hereby incorporated by reference herein in its entirety.

TECHNICAL FIELD

The present invention relates to the technical field of semiconductor, in particular to a Gallium Nitride (GaN)-based high electron mobility transistors (HEMTs) and fabrication method thereof.

RELATED ART

Normally-off or Normally-on GaN-based high electron mobility transistor (HEMT) has three electrodes: source, drain, and gate. Currently, the GaN-based transistor is to utilize two-dimensional electron gas (2DEG) as a channel for device operation, and the transistor is a planar structure.

In the general layout of GaN-based HEMTs, as illustrated in FIG. 1, if a thick protective layer is not used to make the wiring area (PAD) above a thick protective layer, that is, no device is layout under the wiring area (PAD). In conventional layout 100 of GaN-based HEMTs, the area 11 enclosed by thin solid line is the gate layout, the area 13 enclosed by thick solid line is the source layout, and the area 15 enclosed by dotted line is the drain layout. The width (Lg) of the gate can be adjusted by layout, and the Lg can be enlarged by increasing the staggered portion of repetition. This layout requires, in addition to the active area of the device, wiring area (PAD) of the package.

In the conventional layout 200 of GaN-based HEMTs, if a circuitry under Pad (CUP) layout is used in which the device is laid out under the pad area 17, as shown in the FIG. 2. Although this way of layout can reduce the size of device component, it will require an additional metal wiring process to reach the uppermost protective layer, and the PAD will be metallized on the uppermost protective layer. This CUP layout method has the following disadvantages: (a) it requires an additional protective layer process and metal wiring process and (b) it may crack or damage the active area of the device components during wire bonding process.

FIG. 3 illustrates semiconductor device structure according to current technology of manufacturing p-GaN gate structure enhancement HEMTs with enhanced (p-GaN gate HEMTs), which are also called normally-off GaN high electron conductivity transistors (p-GaN gate HEMTs). This method mainly uses an additional layer of p-type GaN (101a, 101b) under the gate electrodes (107a, 107b). A PN junction is formed through the p-type GaN (101a, 101b) layer and the n-type GaN buffer layer to deplete the 2-DEG in the channel, resulting in an enhanced AlGaN/GaN HFET. This process method corresponds to the layout shown in FIG. 1. In the structure of FIG. 3, symbol of components are listed as follows: substrates 104a, 104b; back electrodes 113a, 113b; n-type GaN buffer layers 103a, 103b; AlGaN layers 102a, 102b; p-type GaN gate layers 101a, 101b; gate electrodes 107a, 107b; protective layers 115a, 115b; drain electrodes 105a, 105b; source electrodes 106a, 106b; drain and source contact vias 108a, 108b; gate contact vias 109a, 109b; drain contact metals 111a, 111b; source contact metals 112a, 112b; gate contact metals 110a, 110b; wafer dicing direction 114. After completing the device manufacturing processes, the substrates 104a, 104b are polished and their back side metal process will be performed.

In FIG. 4, after the back substrate is "completely polished or completely removed by other laser methods", a structural cross-sectional view of the back metal process is shown. In both FIG. 3 and FIG. 4, the wafer needs to be diced, and the packaged products are produced. In the structure of FIG. 4, symbol of components are listed as follows: back electrodes 213a, 213b; n-type GaN layers 203a, 203b; AlGaN layers 202a, 202b; p-type GaN gate layers 101a, 101b; n-type GaN buffer layers 203a, 203b; protective layers 115a, 115b; drain electrodes 205a, 205b; source electrodes 206a, 206b; gate electrods 207a, 207b; drain and source contact vias 208a, 208b; gate contact vias 209a, 209b; drain contact metals 211a, 211b; source contact metals 212a, 212b; gate contact metals 210a, 210b; wafer dicing direction 214.

In the structures shown in FIG. 5 and FIG. 6, if individual semiconductor device is a normally-on GaN-based HEMT, there is no p-GaN gate layer epitaxial structure, and the gate metal is directly grown on the AlGaN, and its layout and process methods are also corresponding to the layout of FIG. 1.

In the structure of FIG. 5, the symbol of components are listed as follows: substrate 304a, 304b; back metal electrodes 313a, 313b; n-type GaN layers 303a, 303b; AlGaN layers 302a, 302b; protective layers 315a, 315b; drain electrodes 305a, 305b; source electrodes 306a, 306b; gate electrodes 307a, 307b; drain and source contact vias 308a, 308b; gate contact via 309a, 309b; drain contact metals 311a, 311b; source contact metals 312a, 312b; gate contact metals 310a, 310b; wafer dicing direction 314.

In the structure of FIG. 6, symbol of components are listed as follows: back metal electrodes 413a, 413b; n-type GaN layers 403a, 403b; AlGaN layers 402a, 402b; protective layers 415a, 415b; drain electrodes 405a, 405b; source electrodes 406a, 406b gate electrodes 407a, 407b; drain and source contact vias 408a, 408b; gate contact vias 409a, 409b; drain contact metals 411a, 411b; source contact metals 412a, 412b; gate contact metals 410a, 410b; wafer dicing direction 414

For conventional normally-off or normally-on GaN-based HEMTs, all three electrodes of individual HEMT needs to be packaged by wire bonding.

To solve the above issues, we propose a novel structure of GaN-based HEMTs and a manufacturing method thereof.

SUMMARY

Based on the aforementioned purpose, according to one aspect of the present invention, a Gallium Nitride (GaN)-based high electron mobility transistor (HEMT) is proposed, the GaN-based HEMT includes a substrate, a n-type Gallium Nitride (GaN) layer, an Aluminum Gallium Nitride (AlGaN) layer and a p-type Gallium Nitride (GaN) layer been formed, from bottom to top, on one side of the substrate, wherein the n-type GaN layer is used to generate a two-dimensional electron gas therein and used as a channel layer, the p-type GaN layer and the n-type GaN layer form a pn junction to deplete the two-dimensional electron gas in the channel layer, a backside electrode been formed on other side of the substrate, a source electrode been formed on the AlGaN layer and making ohmic contact with the AlGaN layer, a drain electrode been formed on the AlGaN layer not overlapping the source electrode and making ohmic contact with the AlGaN layer, and a gate electrode been formed on the p-type GaN layer not overlapping the source electrode and the drain electrode, a protective layer been formed over the AlGaN layer, the source electrode, the drain electrode and the gate electrode, a plurality of vias been formed in the protective layer to respectively connect the source electrode, the drain electrode and the gate electrode to outside of the protective layer through metal connection, and a contact via been formed between the outside of the protective layer and the backside electrode, and penetrating through the protective layer, the AlGaN layer, the n-type GaN layer and the substrate to electrically connect one or more electrodes of the source electrode, the drain electrode and the gate electrode to the backside electrode through metal contact.

In one preferred embodiment, material of the substrate includes group consisting of Aluminum Oxide ($Al_2O_3$), Silicon Carbide (SiC), Zinc Oxide (ZnO), Silicon substrate (Si), Gallium Nitride (GaN), Aluminum Gallium Nitride ($Al_xGa_{1-x}N$), Indium Gallium Nitride ($In_xGa_{1-x}N$) and Aluminum Indium Gallium Nitride ($In_xAl_yGa_{1-x-y}N$), where x, y are the contents ($0 \leq x \leq 1$, $0 \leq y \leq 1$).

In one preferred embodiment, materials for making the gate electrode, the source electrode and the drain electrode include Au, Pt/Ti/Pt/Au, Ti/Al/Ti/Au, Ti/Au, Cr/Au, Pt/Ru.

In one preferred embodiment, the other side of the substrate is polished and thinned by a backside polishing process to expose metal contact that filled the contact via before formation of the backside electrode.

In one preferred embodiment, the n-type GaN layer, the p-type GaN layer and the AlGaN layer are formed by molecular beam epitaxy (MBE) or metalorganic vapor phase epitaxy (MOVPE).

According to second aspect of the present invention, a GaN-based HEMT includes a n-type Gallium Nitride (GaN) layer, an Aluminum Gallium Nitride (AlGaN) layer been formed on one side of the n-type GaN layer, and a p-type GaN layer been formed on the AlGaN layer, wherein the n-type GaN layer is used to generate a two-dimensional electron gas therein and used as a channel layer, the p-type GaN layer and the n-type GaN layer form a pn junction to deplete the two-dimensional electron gas in the channel layer, a backside electrode been formed on other side of the n-type GaN layer, a source electrode been formed on the AlGaN layer and making ohmic contact with the AlGaN layer, a drain electrode been formed on the AlGaN layer not overlapping the source electrode and making ohmic contact with the AlGaN layer, and a gate electrode been formed on the p-type GaN layer not overlapping the source electrode and the drain electrode, a protective layer been formed over the AlGaN layer, the source electrode, the drain electrode and the gate electrode, a plurality of vias been formed in the protective layer to respectively connect the source electrode, the drain electrode and the gate electrode to outside of the protective layer through metal connection, and a contact via been formed between the outside of the protective layer and the backside electrode, and penetrating through the protective layer, the AlGaN layer and the n-type GaN layer a to electrically connect one or more electrodes of the source electrode, the drain electrode and the gate electrode to the backside electrode through metal contact.

In one preferred embodiment, materials for making the gate electrode, the source electrode and the drain electrode include Au, Pt/Ti/Pt/Au, Ti/Al/Ti/Au, Ti/Au, Cr/Au, Pd/Au, Ti/Pd/Au Pd/Ti/Au, Cr, Pt/Au, Ni/Au, Ta/Ti, Ti/Pt/Au, Ti/Cr/Au, W/Au, W/Cu, Cu or Pt/Ru.

In one preferred embodiment, the n-type GaN layer, the p-type GaN layer and the AlGaN layer are formed by molecular beam epitaxy (MBE) or metalorganic vapor phase epitaxy (MOVPE).

According to third aspect of the present invention, a GaN-based HEMT includes a substrate, a n-type Gallium Nitride (GaN) layer and an Aluminum Gallium Nitride (AlGaN) layer been formed, from bottom to top, on one side of the substrate, wherein the n-type GaN layer is used to generate a two-dimensional electron gas therein and used as a channel layer, a backside electrode been formed on other side of the substrate, a source electrode been formed on the AlGaN layer and making ohmic contact with the AlGaN layer, a drain electrode been formed on the AlGaN layer not overlapping the source electrode and making ohmic contact with the AlGaN layer, and a gate electrode been formed on the p-type GaN layer not overlapping the source electrode and the drain electrode, a protective layer been formed over the AlGaN layer, the source electrode, the drain electrode and the gate electrode, a plurality of vias been formed in the protective layer to respectively connect the source electrode, the drain electrode and the gate electrode to outside of the protective layer through metal connection, and a contact via been formed between the outside of the protective layer and the backside electrode, and penetrating through the protective layer, the AlGaN layer, the n-type GaN layer and the substrate to electrically connect one or more electrodes of the source electrode, the drain electrode and the gate electrode to the backside electrode through metal contact.

In one preferred embodiment, material of the substrate includes group consisting of Aluminum Oxide ($Al_2O_3$), Silicon Carbide (SiC), Zinc Oxide (ZnO), Silicon substrate (Si), Gallium Nitride (GaN), Aluminum Gallium Nitride ($Al_xGa_{1-x}N$), Indium Gallium Nitride ($In_xGa_{1-x}N$) and Aluminum Indium Gallium Nitride ($In_xAl_yGa_{1-x-y}N$), where x, y are the contents ($0 \leq x \leq 1$, $0 \leq y \leq 1$).

In one preferred embodiment, materials for making the gate electrode, the source electrode and the drain electrode include Au, Pt/Ti/Pt/Au, Ti/Al/Ti/Au, Ti/Au, Cr/Au, Pd/Au, Ti/Pd/Au Pd/Ti/Au, Cr, Pt/Au, Ni/Au, Ta/Ti, Ti/Pt/Au, Ti/Cr/Au, W/Au, W/Cu, Cu or Pt/Ru.

In one preferred embodiment, the n-type GaN layer and the AlGaN layer are formed by molecular beam epitaxy (MBE) or metalorganic vapor phase epitaxy (MOVPE).

In one preferred embodiment, the other side of the substrate is polished and thinned by a backside polishing process to expose metal contact that filled the contact via before formation of the backside electrode.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Figure 1:
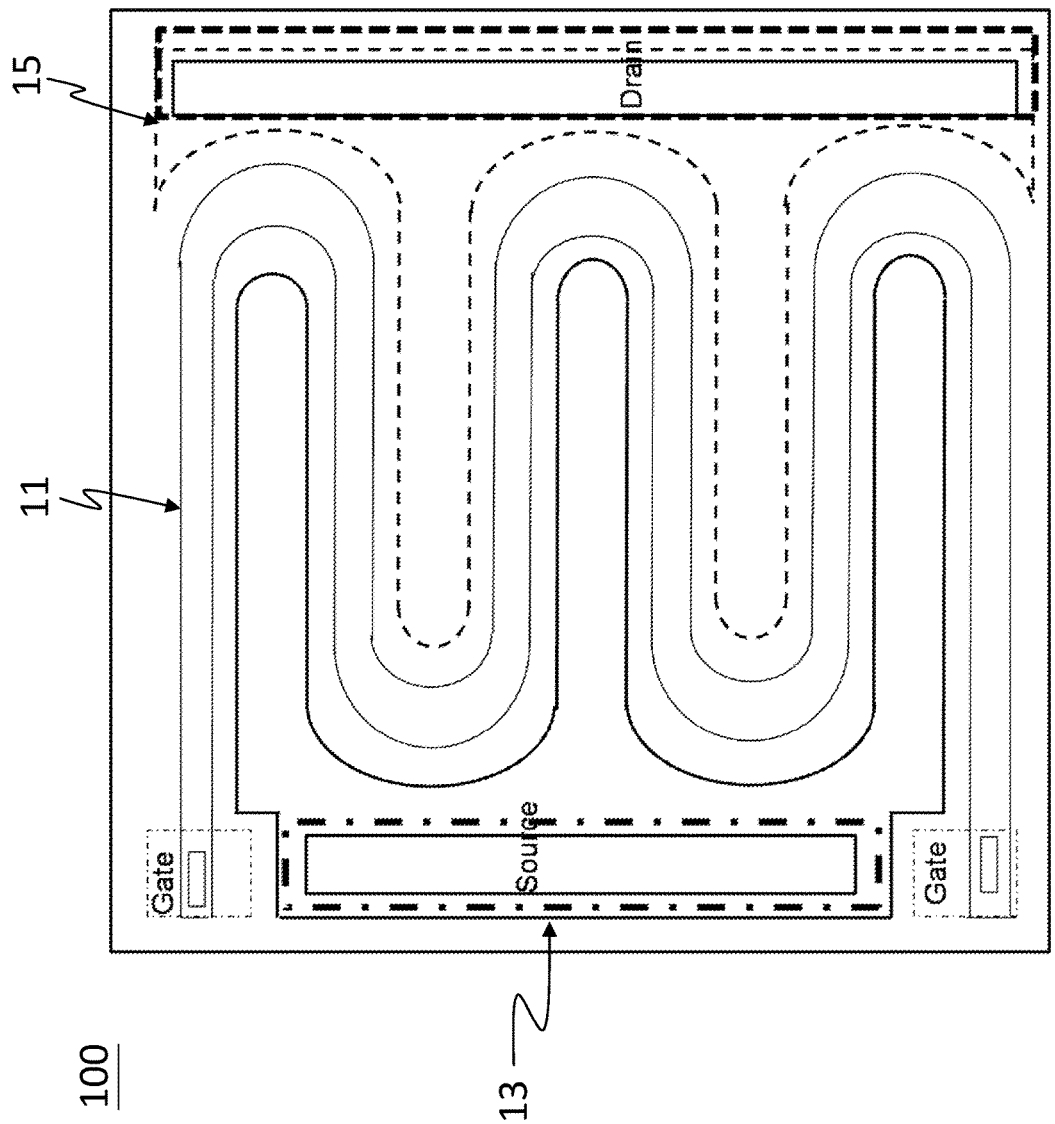
FIG. 1 shows the layout of GaN-based HEMTs with no device layout under the pad area (PAD) according to the prior art.
Figure 2:
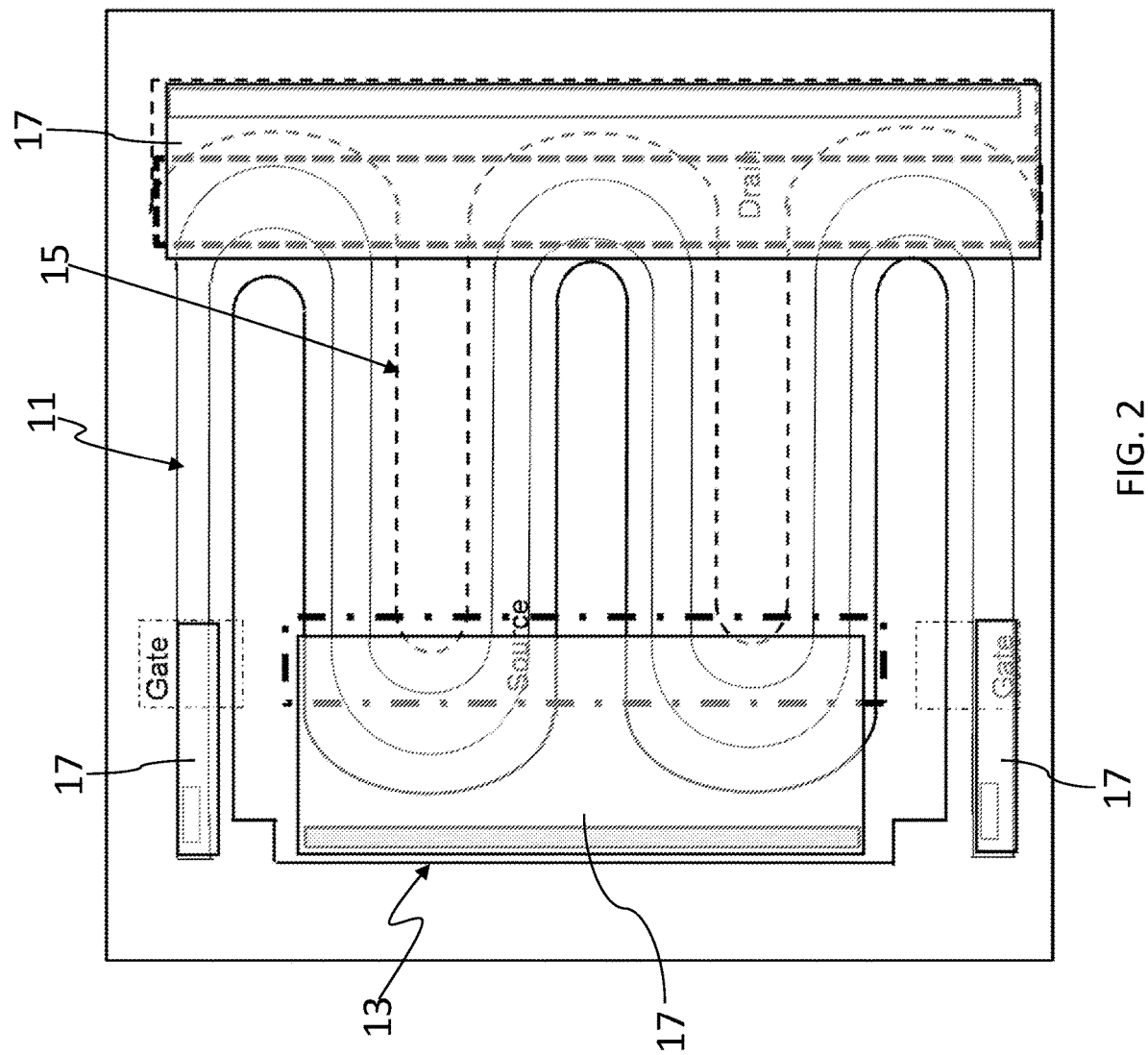
FIG. 2 shows the layout of GaN-based HEMTs with device layout under the pad area (PAD) according to the prior art.
Figure 3:
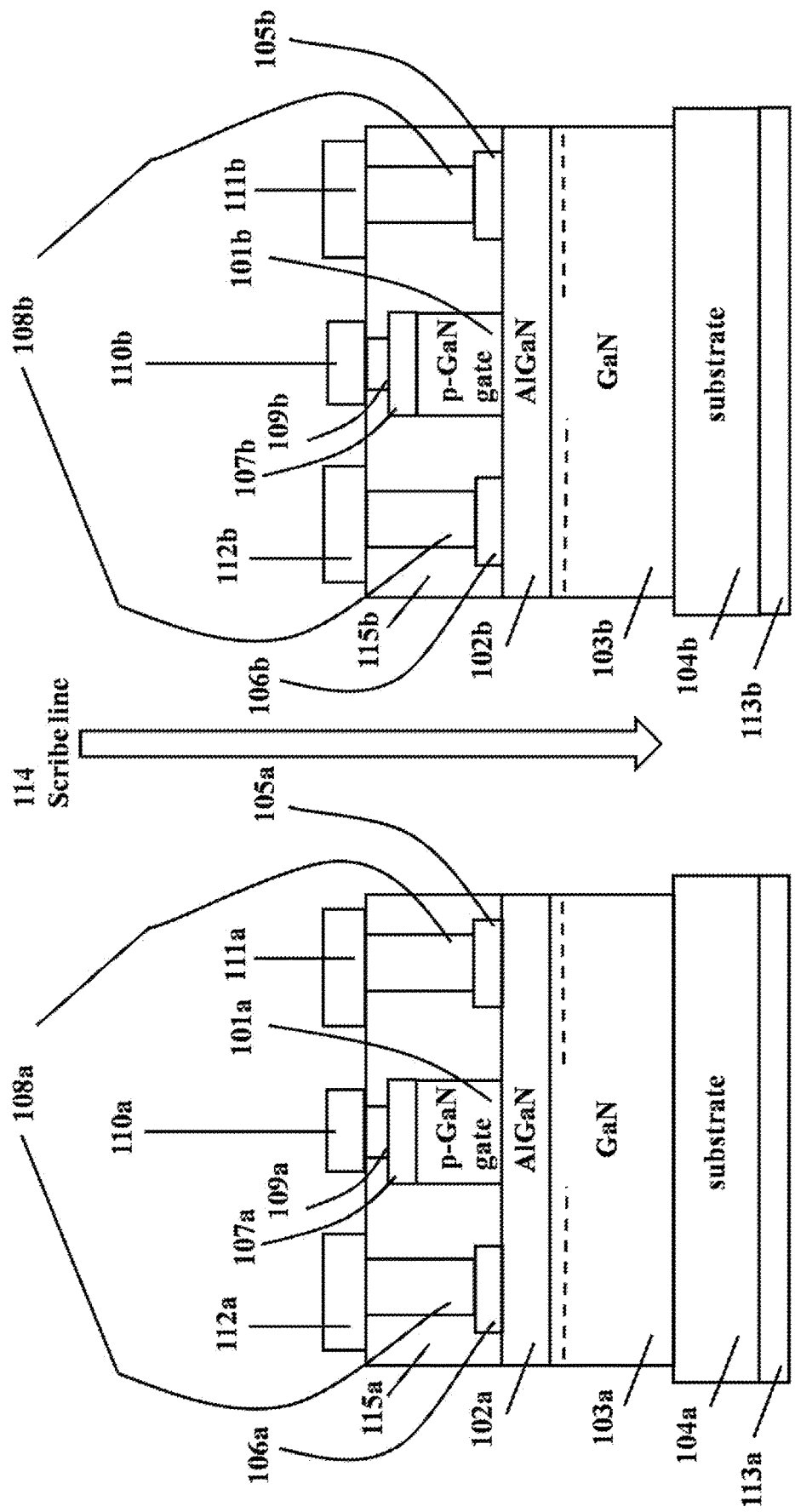
FIG. 3 shows the structure of a p-GaN gate enhanced HEMT (p-GaN gate HEMT) structure, i.e., a normally-off GaN HEMT, fabricated according to the prior art.
Figure 4:
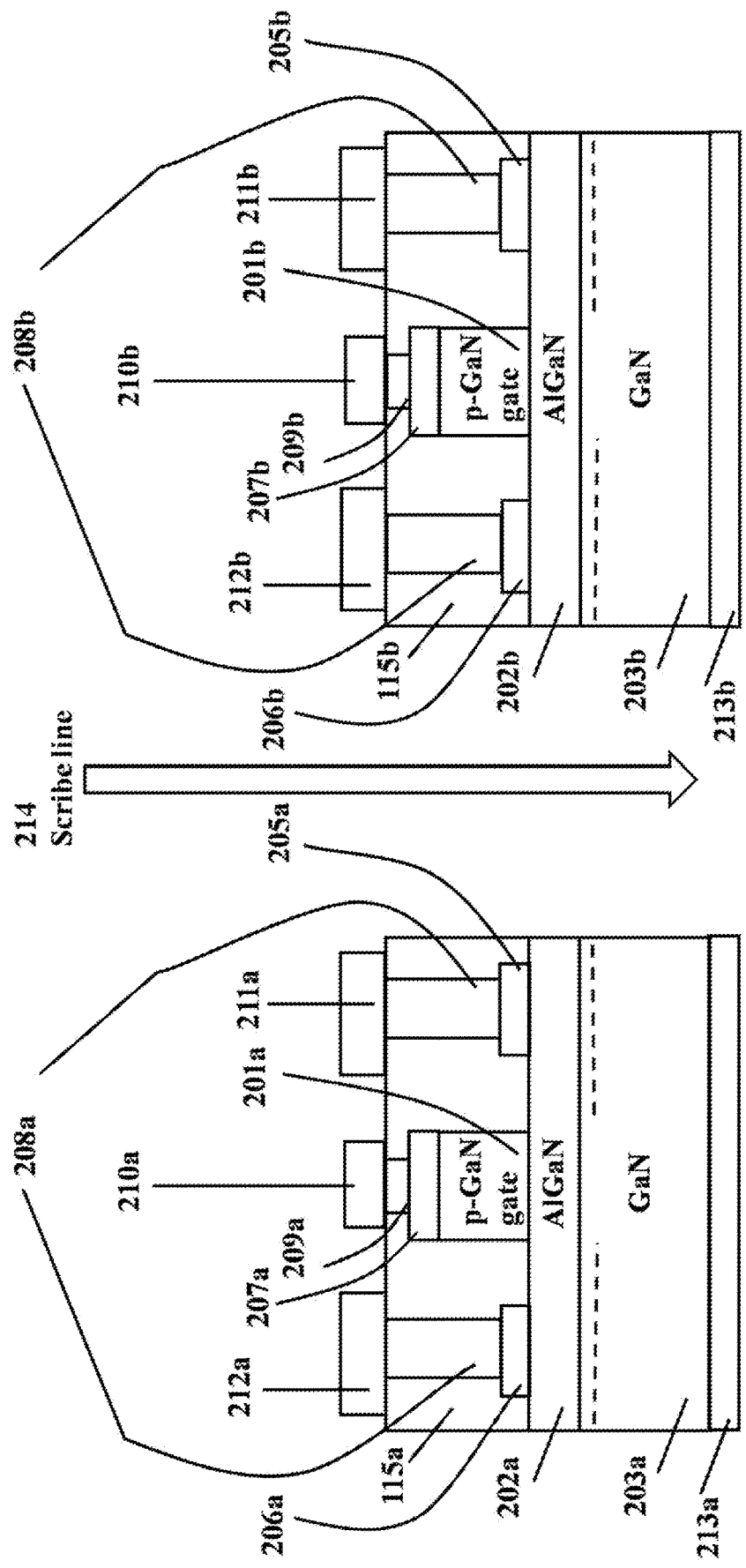
FIG. 4 is a cross-sectional view of the normally-off GaN-based HEMT structure as shown in FIG. 3 fabricated according to the prior art, after the back substrate is completely removed.
Figure 5:
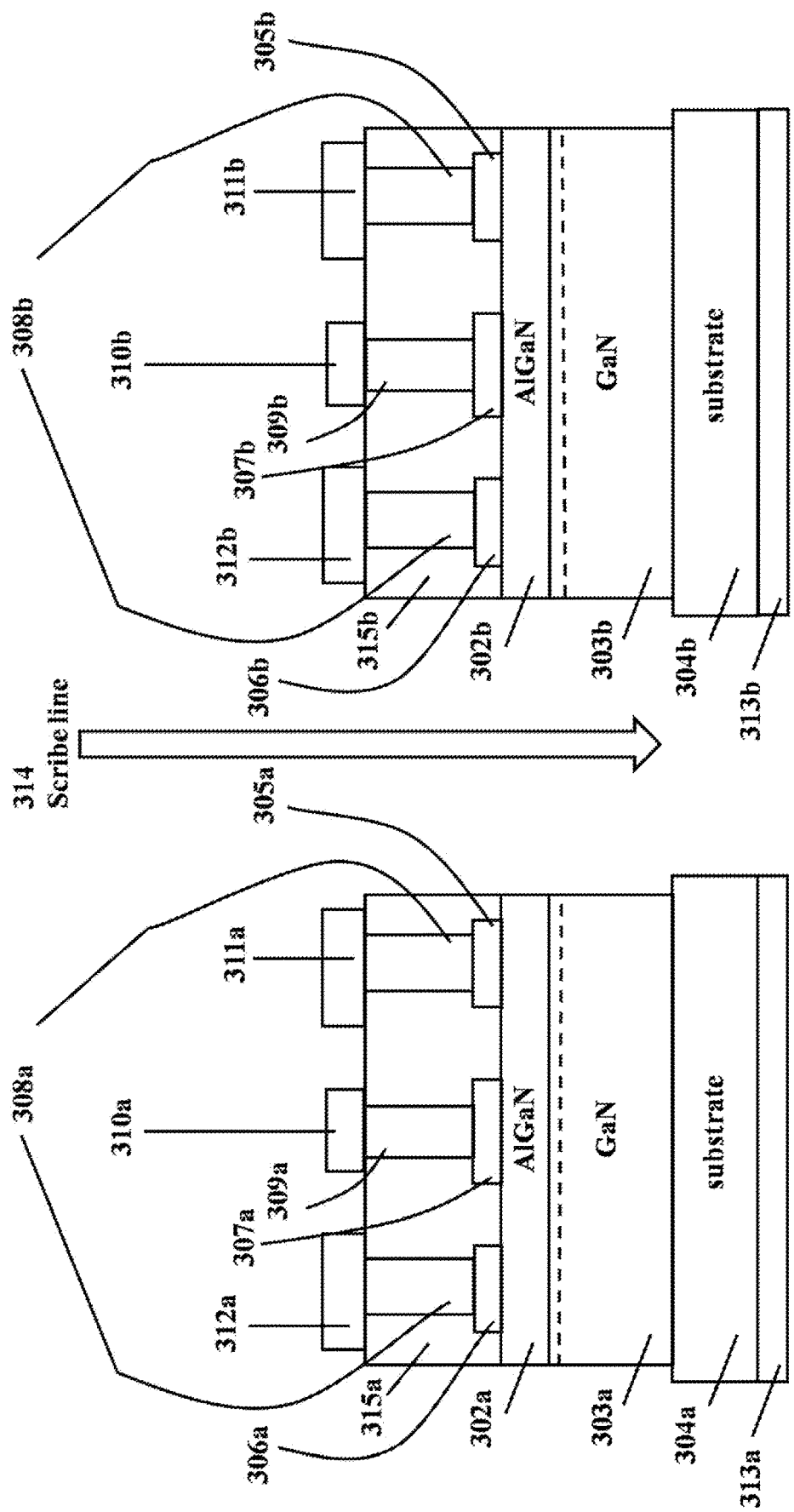
FIGS. 5-6 show cross-sectional views of normally-on GaN-based HEMTs fabricated according to the prior art.
Figure 6:
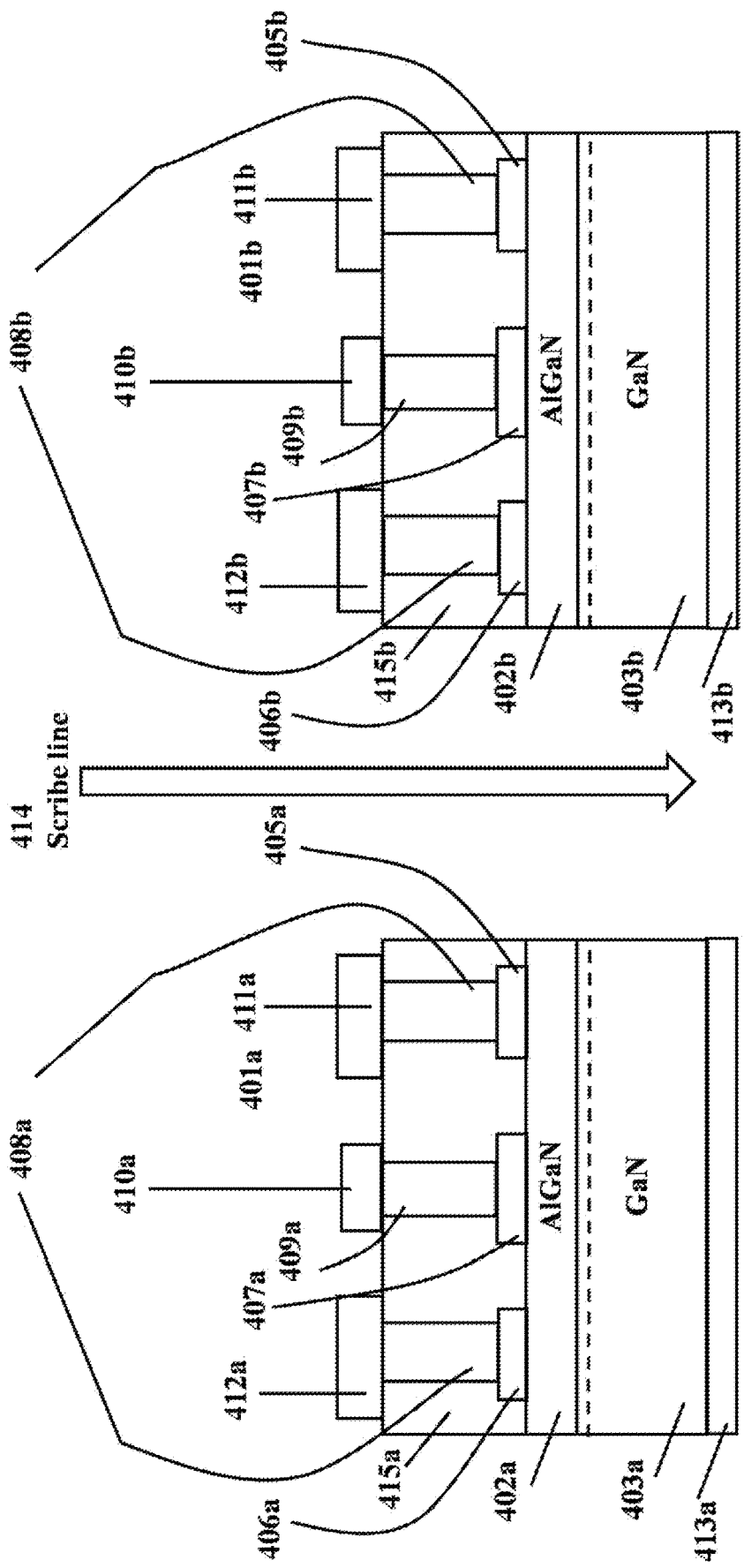

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

In order to solve the technical issues of conventional normally-off or normally-on GaN-based HEMTs, three electrodes (source, gate and drain) of each HEMT need to be packaged by wire bonding. The present invention proposes a process integration method with a deep etching process, which utilizes the process integration method for connecting electrode metals of the normally-off or normally-on GaN-based HEMTs to the back electrode, so that among the three electrodes, i.e., the source, gate or drain electrode, a single one or more electrodes can be connected the back electrode.

The method proposed by the present invention is described as follows, where the electrode of the HEMTs to be connected to the back electrode through deep etching vias by using one additional deep etching process. In this way, there is no need to place PAD on various positions as wire bonding electrodes on the upper layer, which can reduce the area of the device layout. The new GaN-based HEMT structure proposed in the present invention is a design of connecting the electrode(s), i.e. source, gate or drain electrode, and the back electrode of a normally-off or normally-on GaN-based HEMT. This process integration technology can not only reduce the layout area, but also reduce the parasitic effect due to the device package, and also make the wiring of the device components easier in the package process.

According to one embodiment of the present invention, the normally-off or normally-on GaN-based HEMT structure and their related process integration method proposed, the method for forming the GaN layer and AlGaN layer include molecular beam epitaxy (MBE) method or metalorganic vapor-phase epitaxy (MOVPE) method.

According to one embodiment of the present invention, the normally-off or normally-on GaN-based HEMTs structure and their related process integration method proposed, the material of the semi-insulating crystal growth substrate includes the group consisting of Aluminum Oxide ($Al_2O_3$), Silicon Carbide (SiC), Zinc Oxide (ZnO), Silicon substrate (Si), Gallium Nitride (GaN), Aluminum Gallium Nitride ($Al_xGa_{1-x}N$), Indium Gallium Nitride ($In_xGa_{1-x}N$) and Aluminum Indium Gallium Nitride ($In_xAl_yGa_{1-x-y}N$), where x, y are the contents ($0 \leq x \leq 1$, $0 \leq y \leq 1$).

According to one embodiment of the present invention, the normally-off or normally-on GaN-based HEMTs structure and their related process integration method proposed, the materials for making Schottky gate electrode, the source electrode and the drain electrode include Au, Pt/Ti/Pt/Au, Ti/Al/Ti/Au, Ti/Au, Cr/Au, Pd/Au, Ti/Pd/Au Pd/Ti/Au, Cr, Pt/Au, Ni/Au, Ta/Ti, Ti/Pt/Au, Ti/Cr/Au, W/Au, W/Cu, Cu or Pt/Ru.

According to one embodiment of the present invention, the normally-off or normally-on GaN-based HEMTs structure and their related process integration method proposed, the materials for making metal connections include Au, Pt/Ti/Pt/Au, Ti/Al/Ti/Au, Ti/Au, Cr/Au, Pt/Ru.

According to one embodiment of the present invention, the normally-off or normally-on GaN-based HEMTs structure and their related process integration method proposed, etching methods include dry etching and wet etching techniques.

Normally-off or normally-on GaN-based HEMTs, both types of which can utilize this process technology to achieve the structure described in the present invention.

With regard to the techniques, means and effects of the present invention, preferred embodiments are hereby listed and described in detail with the drawings. It is believed that the above-mentioned purposes, structures and features of the present invention can be obtained from them for a thorough and specific understanding.

Figure 7:
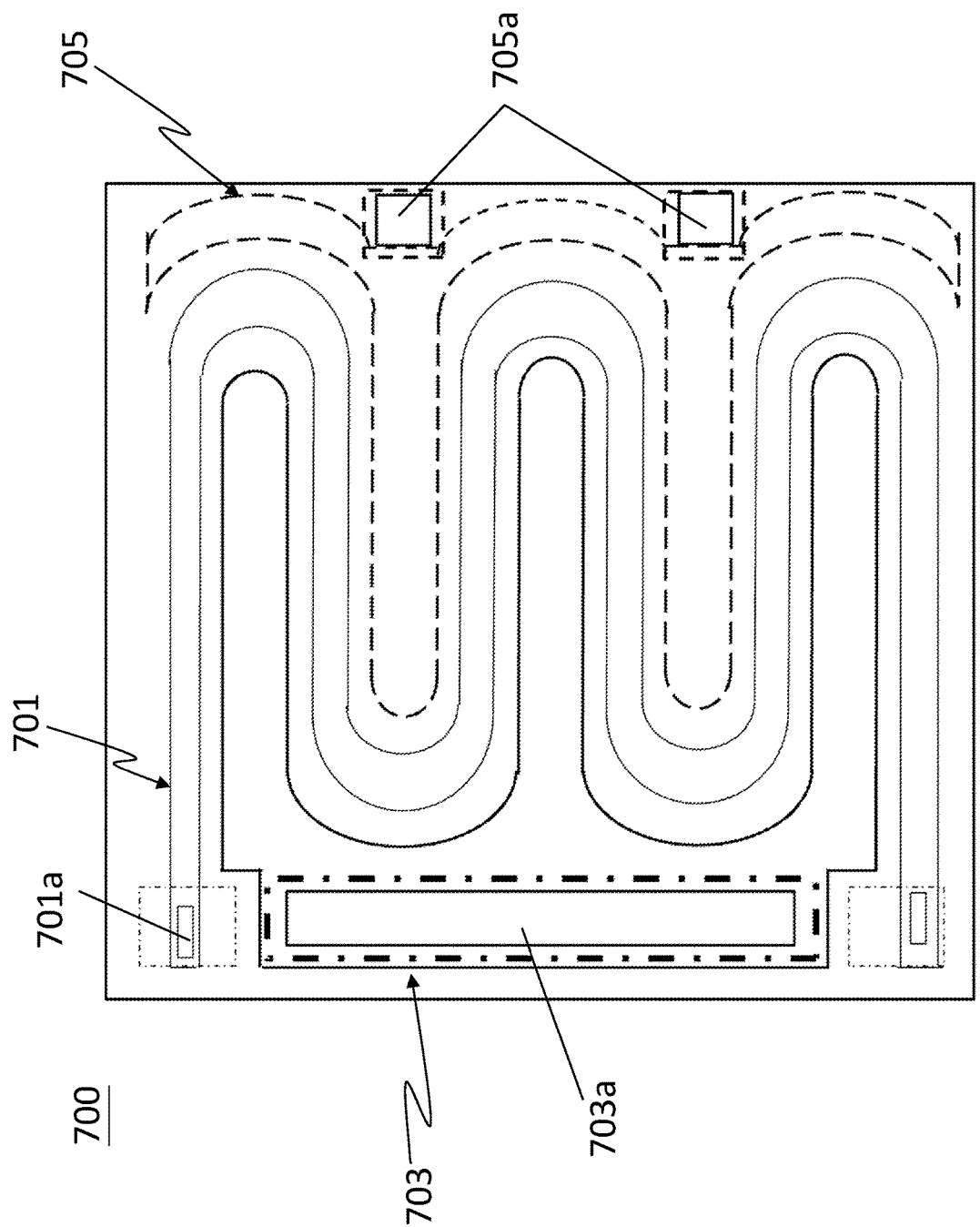
FIG. 7 shows a layout for fabricating GaN-based HEMTs according to a preferred embodiment of the present invention.

Referring to FIG. 7, it shows a layout 700 implemented for the fabrication of GaN-based HEMTs according to an embodiment of the present invention, the region 701 surrounded by the thin solid line is the gate layout, and the region 703 enclosed by the thick solid line is the source layout, and the region 705 enclosed by the dotted line is the drain layout. The corresponding electrodes of the region 701 and 703 are the gate electrode 701a and the source electrode 703a respectively, and the corresponding electrode region 705a on the right side of the layout is the metal electrodes connected downward to the back electrode of the GaN-based HEMTs, which can be used as a source or drain electrode.

Figure 8:
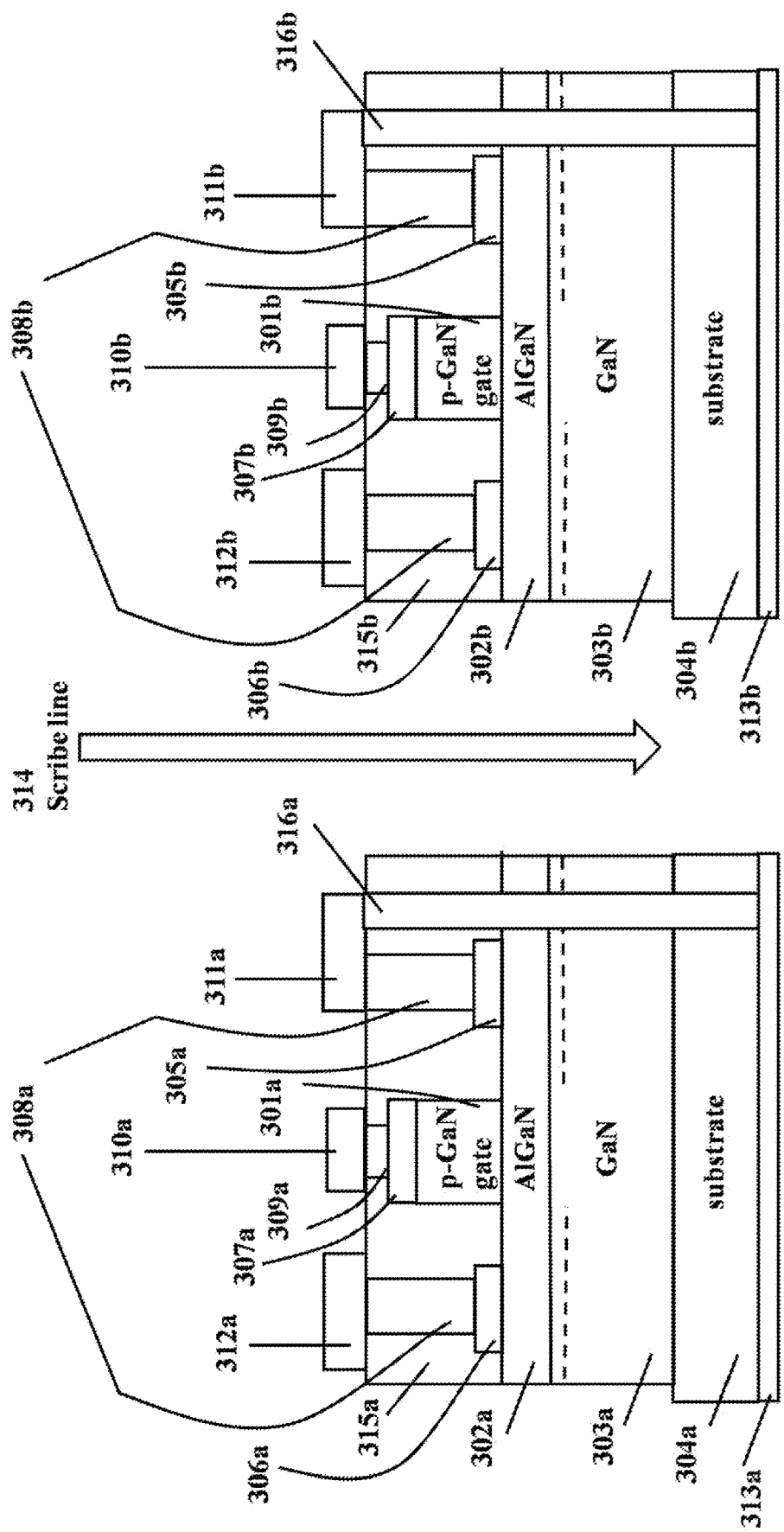
FIGS. 8-9 are cross-sectional views illustrating the structure of a normally-off GaN-based HEMTS with electrodes connected to backside electrode formed by deep etching process according to a preferred embodiment of the present invention.

FIG. 8 illustrates a device structure formed by a technology for fabricating p-type GaN gate enhanced high electron conductivity transistors (p-GaN gate HEMTs) proposed according to an embodiment of the present invention, which can also be called normally-off GaN-based HEMTs. This method mainly utilizes forming an additional layer of p-type GaN (301a, 301b) layer under the gate electrode (307a, 307b), a PN junction is formed via the p-type GaN layer (301a, 301b) and the n-type GaN buffer layer (303a, 303b) to deplete the 2-DEG in the channel, and the electrode of the enhancement mode AlGaN/GaN HFET (normally-off GaN-based HEMT) is connected to the back electrode through a deep etching process. Wherein, each of the n-type gallium nitride buffer layers (303a, 303b) is used for generating a 2-DEG therein and used as a channel layer.

The deep etching process proposed in the present invention is not limited to the above-mentioned method applied to the process integration method for connecting the electrode metal(s) of the normally-off GaN-based HEMT to its back electrode, and the same process method can also be applied to the normally-on GaN-based HEMT for connecting the electrode metal(s) of the normally-on GaN-based HEMT to its back electrode.

For example, the electrode metal(s) of the enhancement mode AlGaN/GaN HFET (normally-off GaN-based HEMT) is connected to its back electrode through a deep etch process. This process can connect among the source, gate or drain electrodes, one or more electrodes of the GaN-based HEMT to its back electrode. This process method corresponds to the layout illustrated in FIG. 7.

Figure 9:
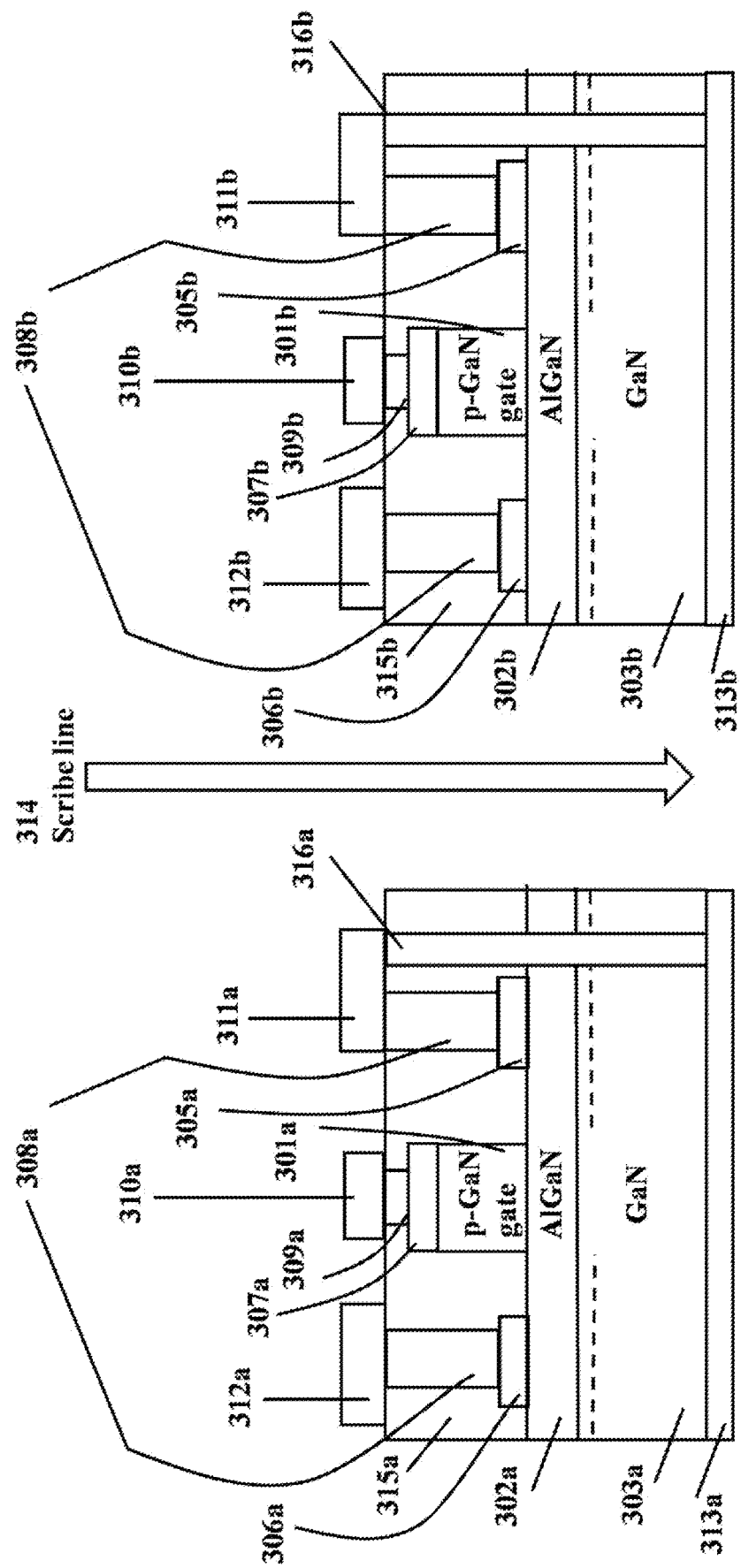

In the structure of FIG. 8, symbols of device components are as listed follows: substrates 304a, 304b; back electrodes 313a, 313b; n-type GaN buffer layers 303a, 303b; AlGaN layers 302a, 302b; p-type GaN gate layers 301a, 301b; gate electrodes 307a, 3107b; protective layers 315a, 315b; drain electrodes 305a, 305b; source electrodes 306a, 306b; drain and source contact vias 308a, 308b; gate contact vias 309a, 309b; drain contact metals 311a, 311b; source contact metals 312a, 312b; gate contact metals 310a, 310b; deep etching vias 316a, 316b; wafer dicing direction 314. After completing the device manufacturing process, the substrates 313a, 313b are polished and their back side metal process will be performed. The final structure is shown in FIG. 9.

Figure 10:
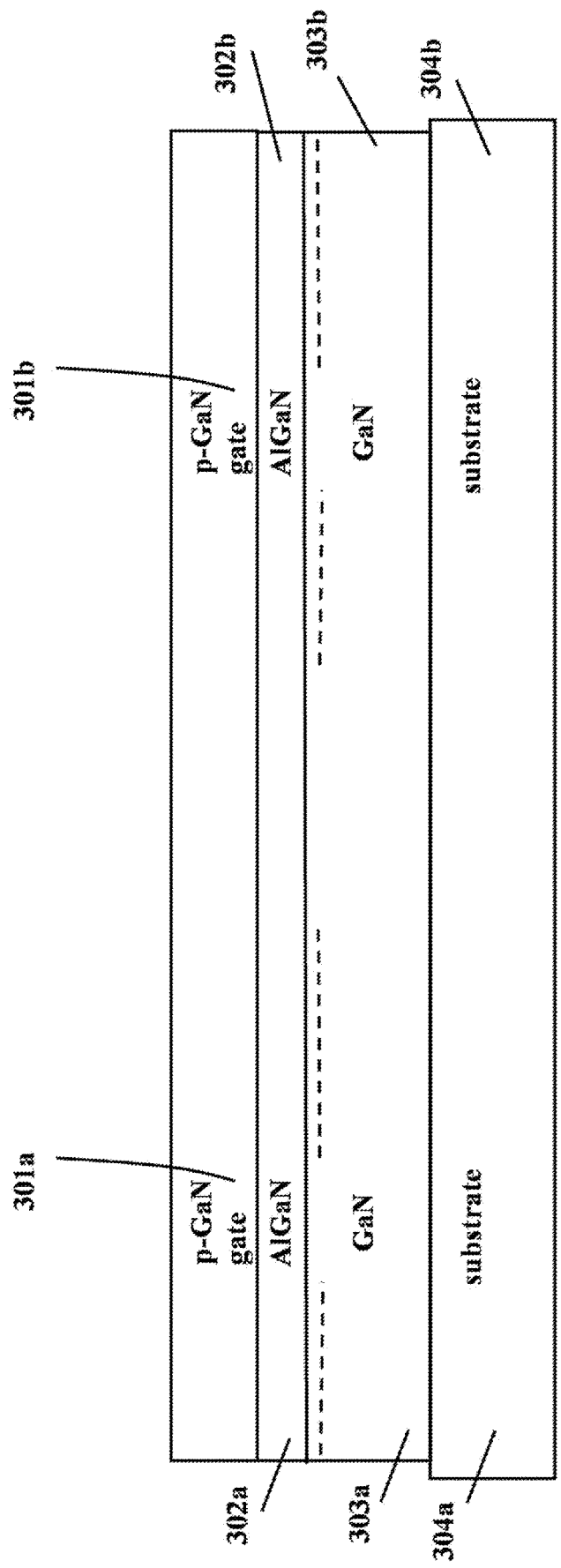
FIG. 10 shows the original structure of a normally-off GaN-based HEMT with electrode connected to backside electrode by using a deep etching process according to a preferred embodiment of the present invention.

One embodiment of the present invention provides a process integration method for preparing a normally-off GaN-based HEMTs structure with electrode metal(s) of individual transistor connected to their corresponding back electrode. Referring to FIG. 10, a multi-layer epitaxial structure is prepared first. The multi-layer epitaxial structure from top to bottom includes a p-type gallium nitride (GaN) gate layer (301a, 301b), an aluminum gallium nitride (AlGaN) layer (302a, 302b), a n-type gallium nitride (GaN) layer (303a, 303b) and a substrate (304a, 304b).

Figure 11:
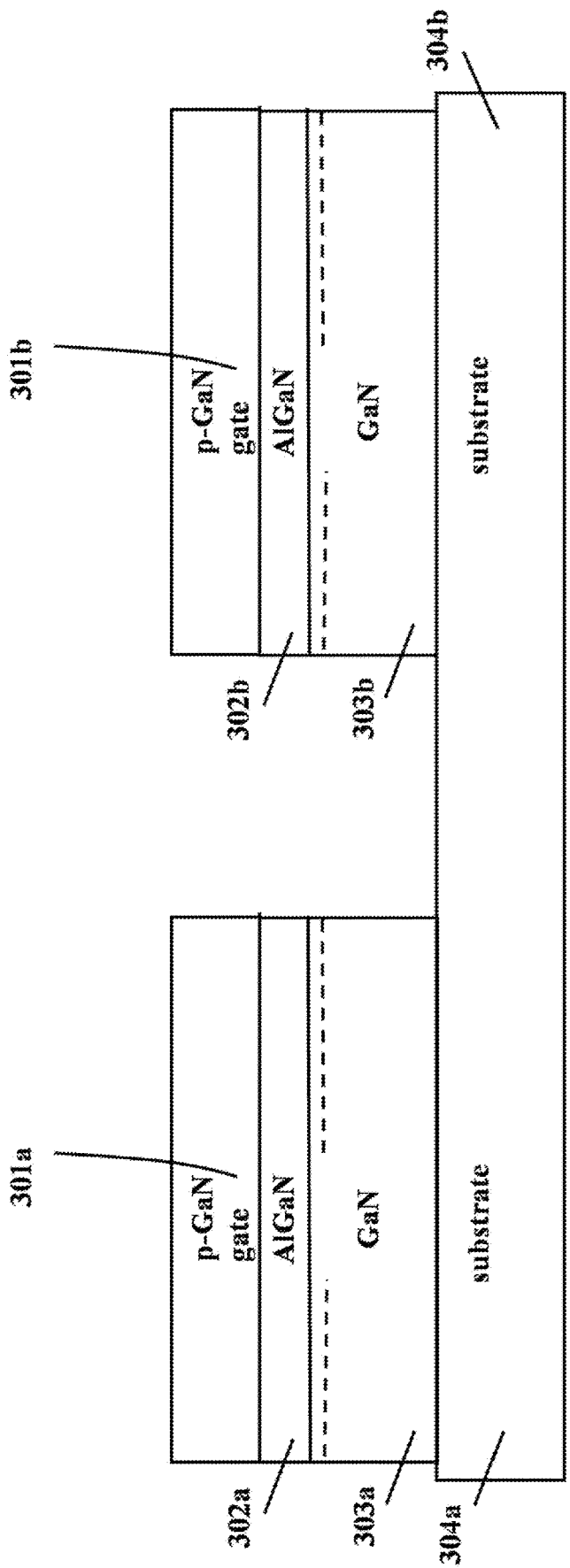
FIG. 11 shows a schematic cross-sectional view of defining a device isolation structure using a photomask and etching according to a preferred embodiment of the present invention.

Next, a first photomask (MESA) process is used to define a device region, and the p-type gallium nitride (GaN) gate layer (301a, 301b), the aluminum gallium nitride (AlGaN) layer (302a, 302b) and the n-type gallium nitride (GaN) layers (303a, 303b) outside the device region are removed by an etching process. This step utilizes a photomask (MESA) and etching process to form a device isolation structure as shown in FIG. 11.

Figure 12:
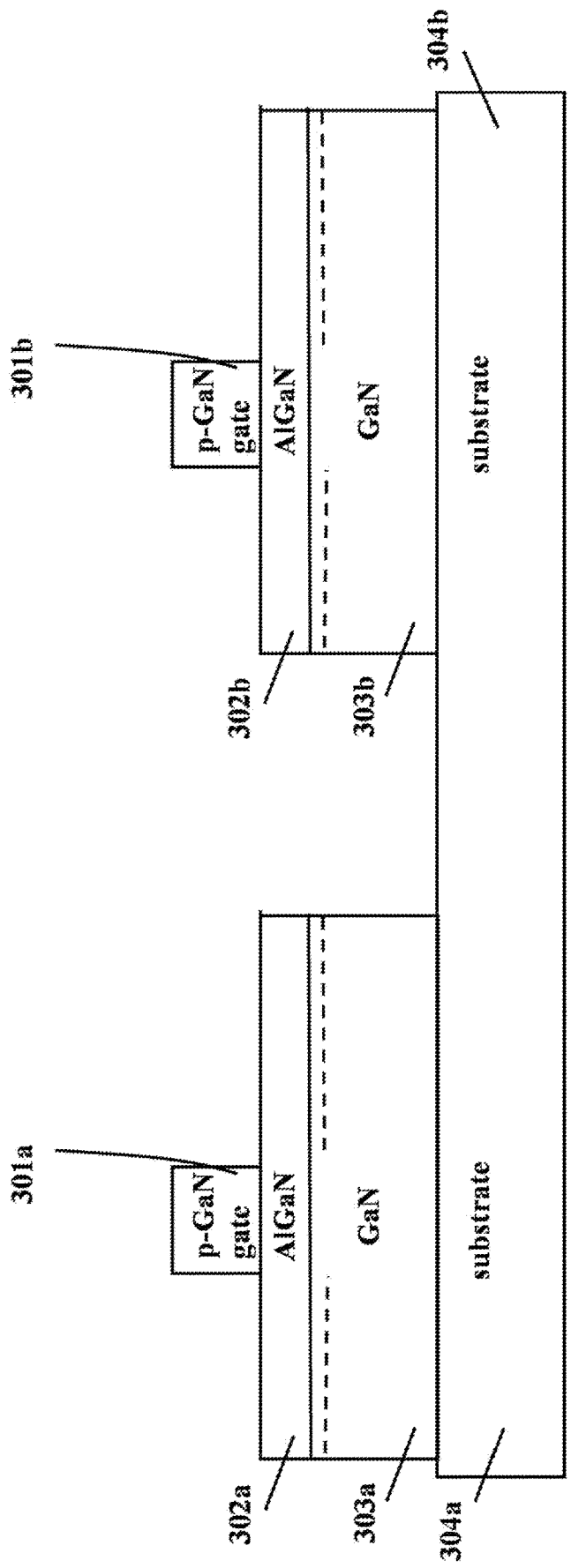
FIG. 12 is a schematic cross-sectional view illustrating a gate region structure of a p-GaN gate layer defined by a photomask and etching processes according to a preferred embodiment of the present invention.

A second photomask (MESA) process is used to define the gate region of the p-GaN gate layer (301a, 301b), and perform etching process to remove the p-GaN gate layer (301a, 301b) outside the gate region to the AlGaN layer (302a, 302b) to form the structure shown in FIG. 12.

Figure 13:
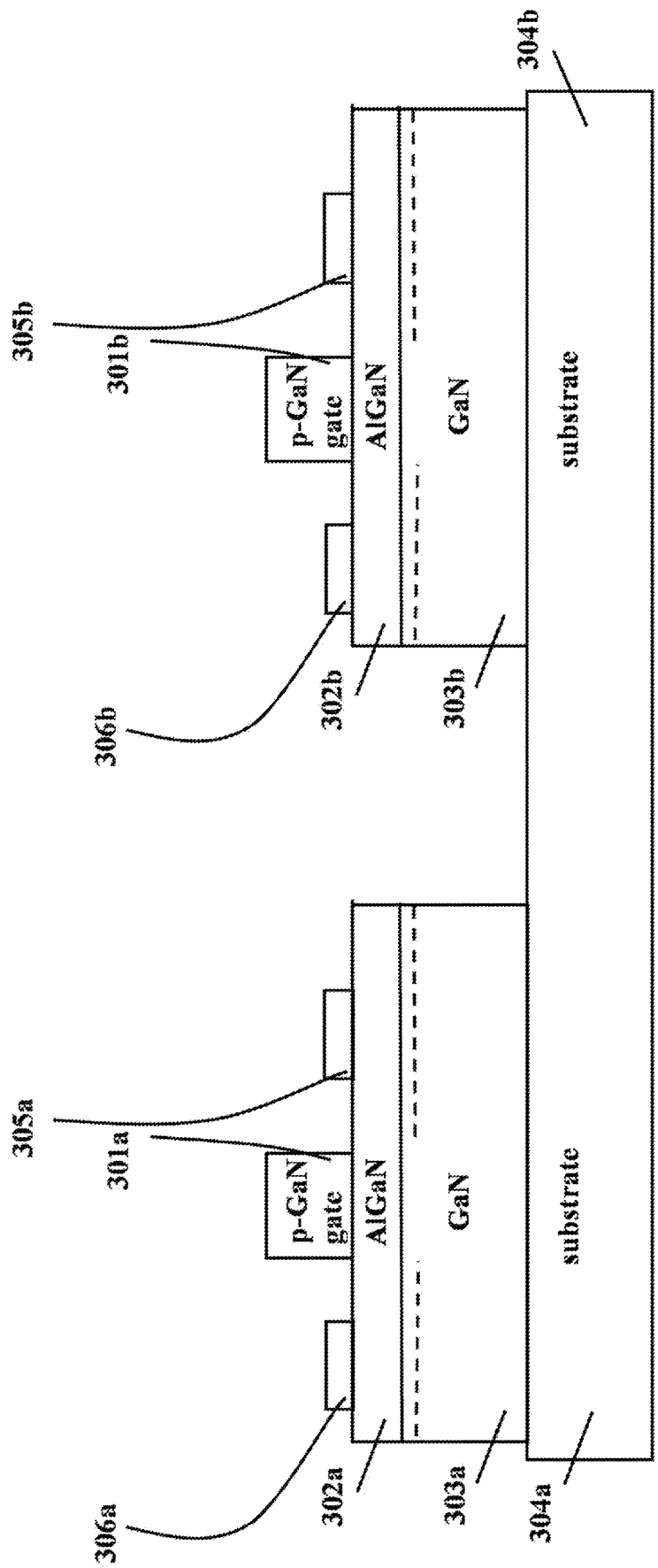
FIG. 13 shows a schematic cross-sectional view of defining the structure of the drain electrode and the source electrode region by using a photomask and a metal deposition processes according to a preferred embodiment of the present invention.

Next, regions of drain electrodes (305a, 305b) and source electrodes (306a, 306b) are defined by using a third photomask process and a first metal deposition process to form the structure shown in FIG. 13. The drain metals (305a, 305b) form ohmic contacts with the aluminum gallium nitride layer (302a, 302b); the source electrodes (306a, 306b) form ohmic contacts with the aluminum gallium nitride layers (302a, 302b).

Figure 14:
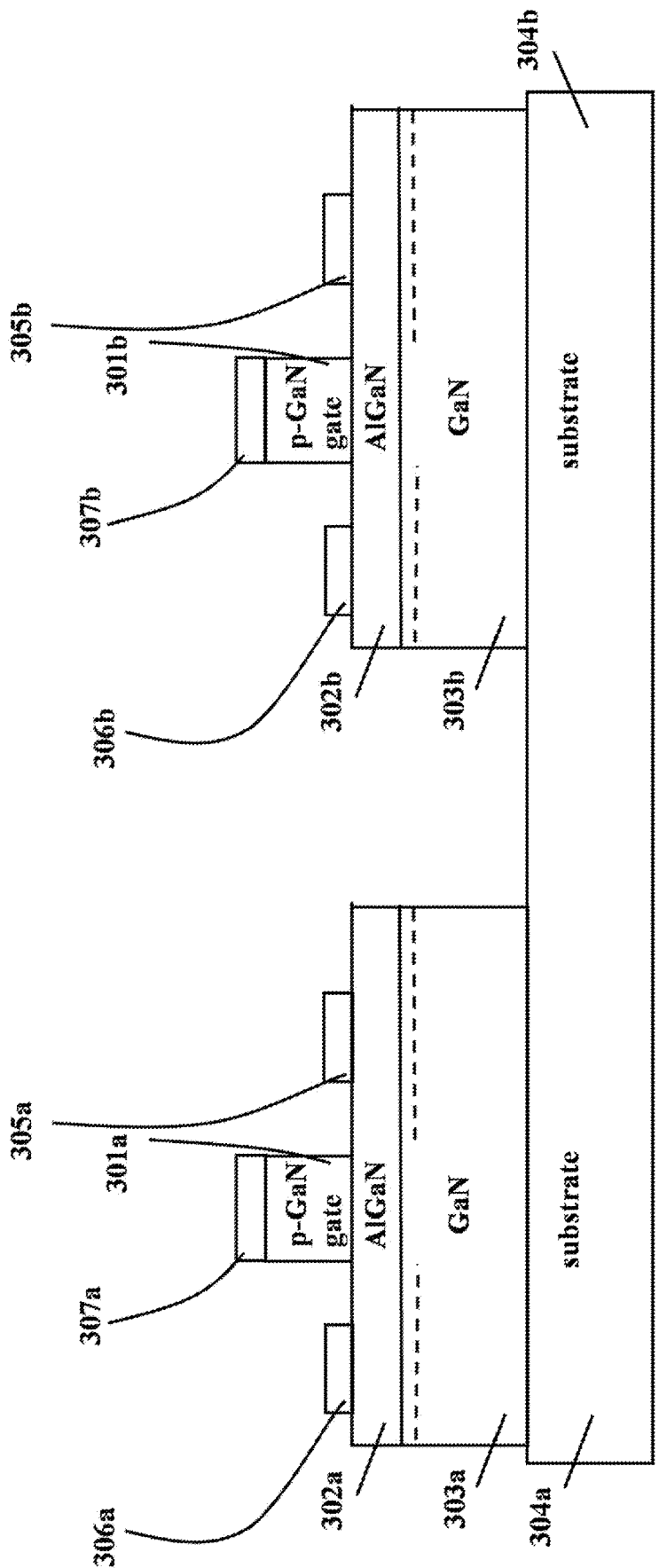
FIG. 14 shows a schematic cross-sectional view of forming a gate electrode structure on the gate region of the p-GaN gate layer by using a photomask and metal deposition processes according to a preferred embodiment of the present invention.

Gate electrodes (307a, 307b) are formed on the gate regions of the p-GaN gate layers (301a, 301b) by means of a fourth photomask process and a second metal deposition process to form the structure shown in FIG. 14.

Figure 15:
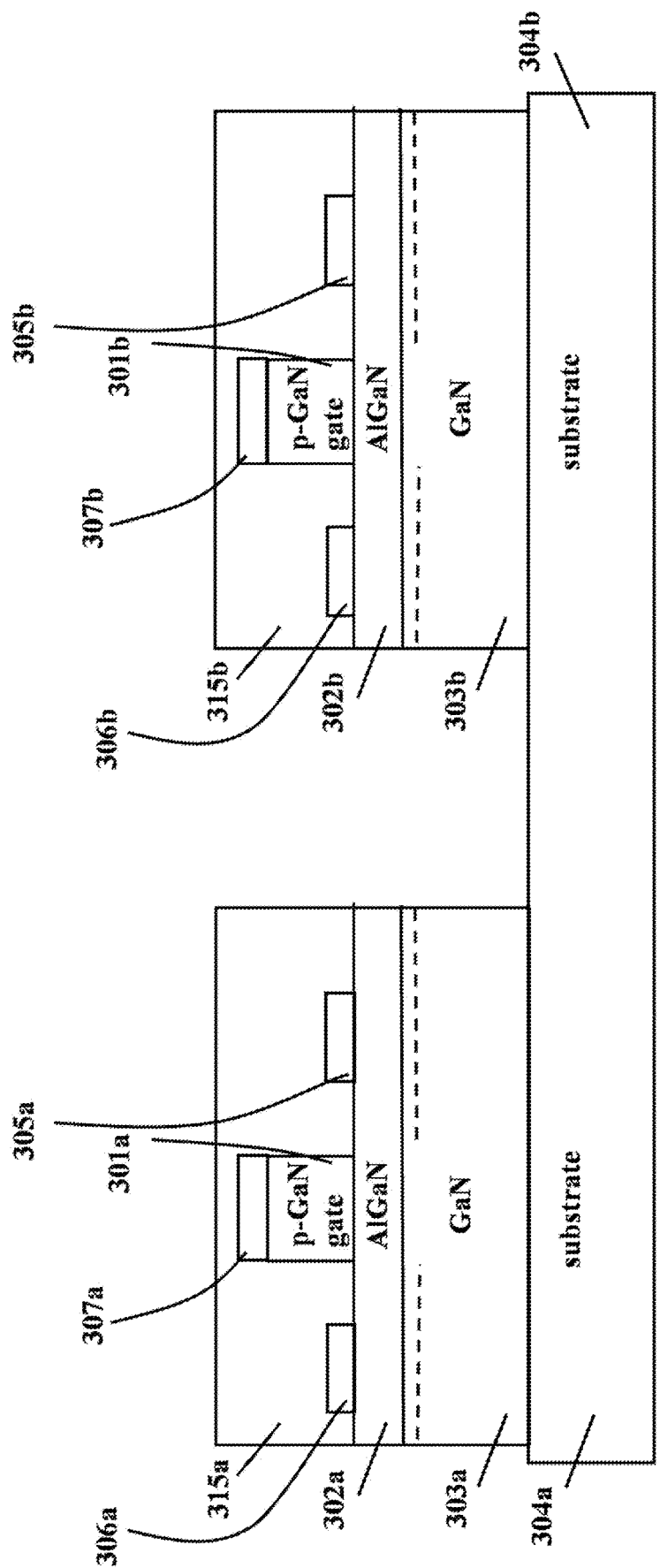
FIG. 15 shows a schematic cross-sectional view of a protective layer structure formed over an AlGaN layer, a drain electrode, a source electrode, and a gate electrode by depositing an epitaxial layer material according to a preferred embodiment of the present invention.

Utilizing a fifth photomask process and a first epitaxial layer material depositing process, protective layers (315a, 315b) are formed over the AlGaN layers (302a, 302b), the drain electrodes (305a, 305b), the source electrodes (306a, 306b) and the gate electrodes (307a, 307b) with a structure shown is depicted in FIG. 15.

Next, drain and source contact vias (308a, 308b), and gate contact vias (309a, 309b) are formed in the protective layers (315a, 315b) by using a sixth photomask process and an etching process. The structure is shown in FIG. 16.

Figure 16:
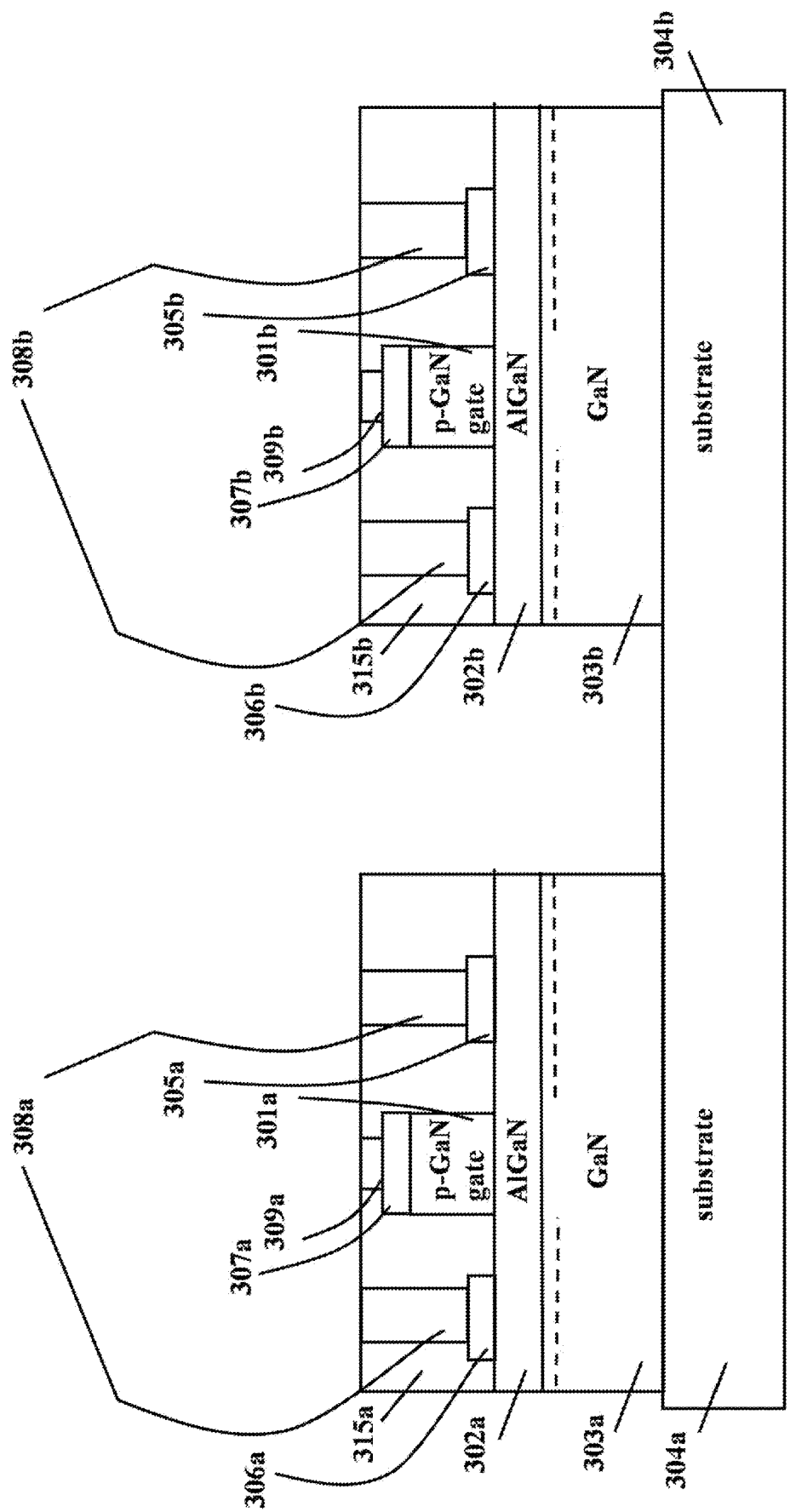
FIG. 16 shows a schematic cross-sectional view of forming drain and source contact vias and gate contact vias in the protective layer by using a photomask and an etching processes according to a preferred embodiment of the present invention.
Figure 17:
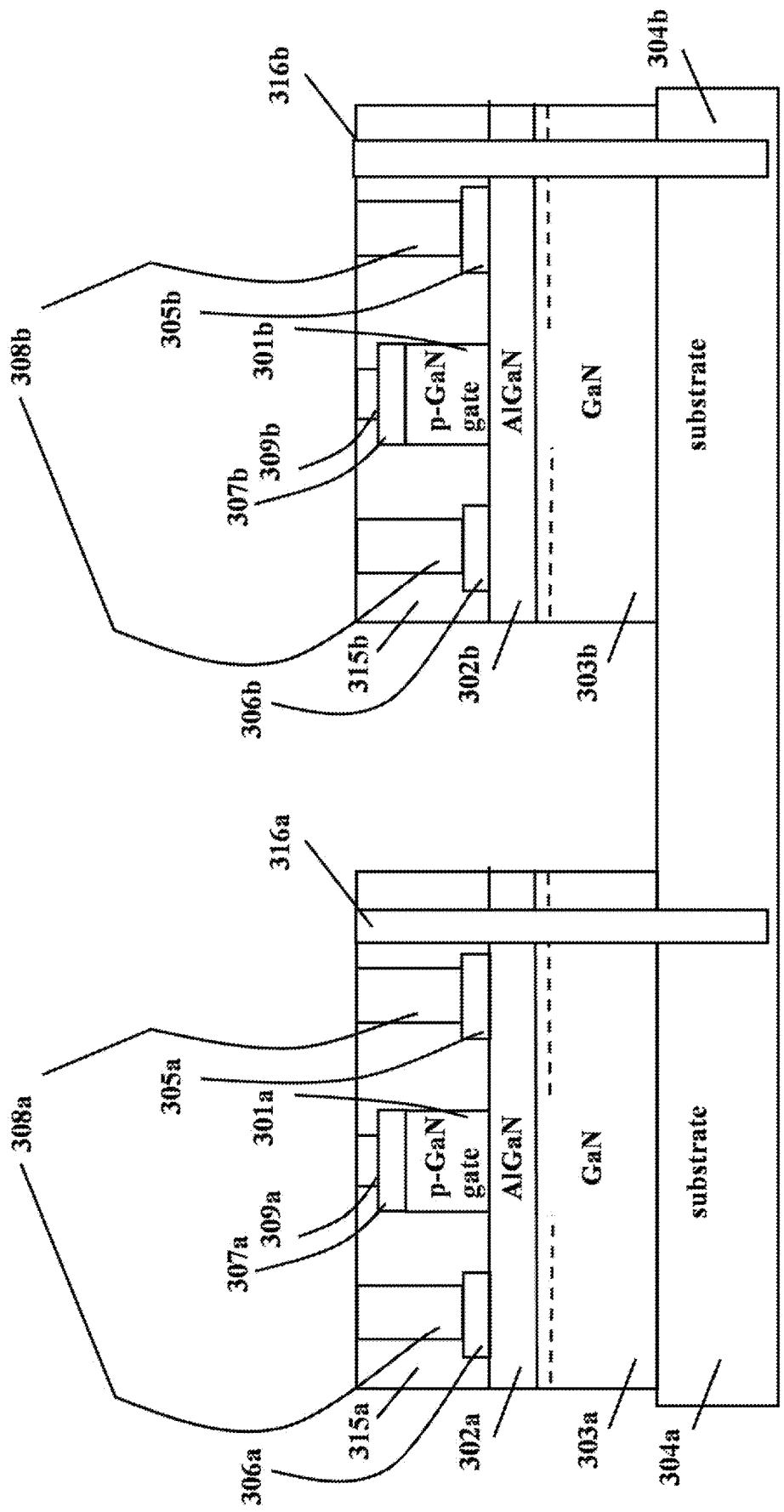
FIG. 17 shows a schematic cross-sectional view the formation of deep etching contact vias penetrating the protective layer, the AlGaN layer, the n-type gallium nitride (GaN) layer and deep into the substrate using a photomask and deep etching processes, followed by metal deposition to fill the respective contact vias according to a preferred embodiment of the present invention.

After forming drain and source contact vias (308a, 308b), and gate contact vias (309a, 309b) in the protective layers (315a, 315b) as shown in FIG. 16. A seventh photomask process and a deep etching process are performed to form deep etching contact vias (316a, 316b) that penetrate the protective layer (315a, 315b), the AlGaN layer (302a, 302b), the n-type gallium nitride (GaN) layer (303a, 303b) and penetrate deep into the substrate. These deep etching contact vias (316a, 316b) are used as deep etching contact vias from source (drain) to substrate. After the deep etching contact vias (316a, 316b) being formed, a third metal deposition process is then performed to fill drain and source contact vias (308a, 308b), gate contact vias (309a), 309b) and deep etching contact vias (316a, 316b), the structure is shown in FIG. 17.

Figure 18:
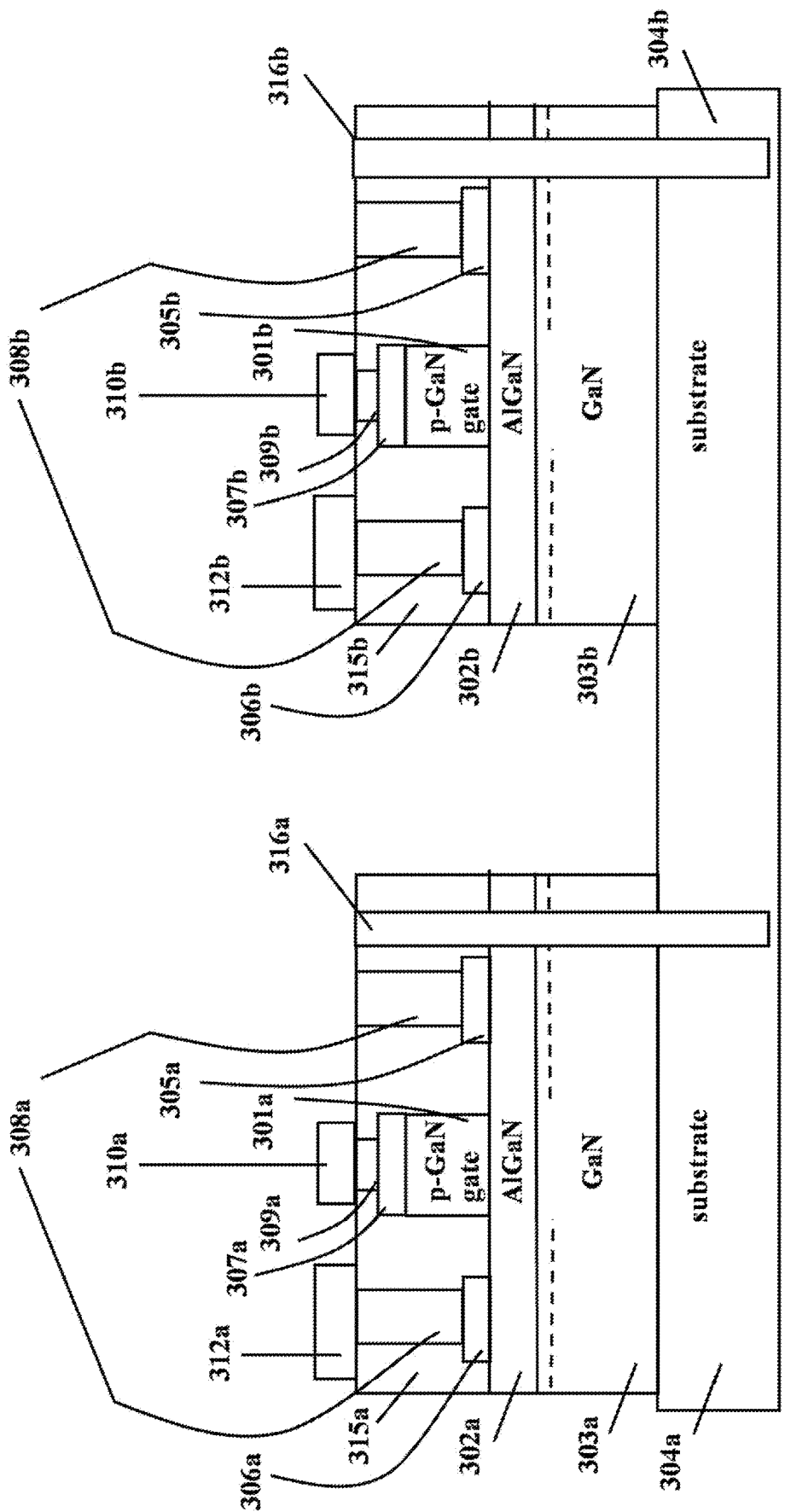
FIG. 18 shows a schematic cross-sectional view of forming a source and gate metal bonding areas (PADs) by using a photomask and metal deposition processes according to a preferred embodiment of the present invention.

Next, source metal bonding areas (PADs) (312a, 312b) and gate metal bonding areas (PADs) (310a, 310b) are formed by using a eighth photomask process and a fourth metal deposition process. The structure is shown in FIG. 18.

Figure 19:
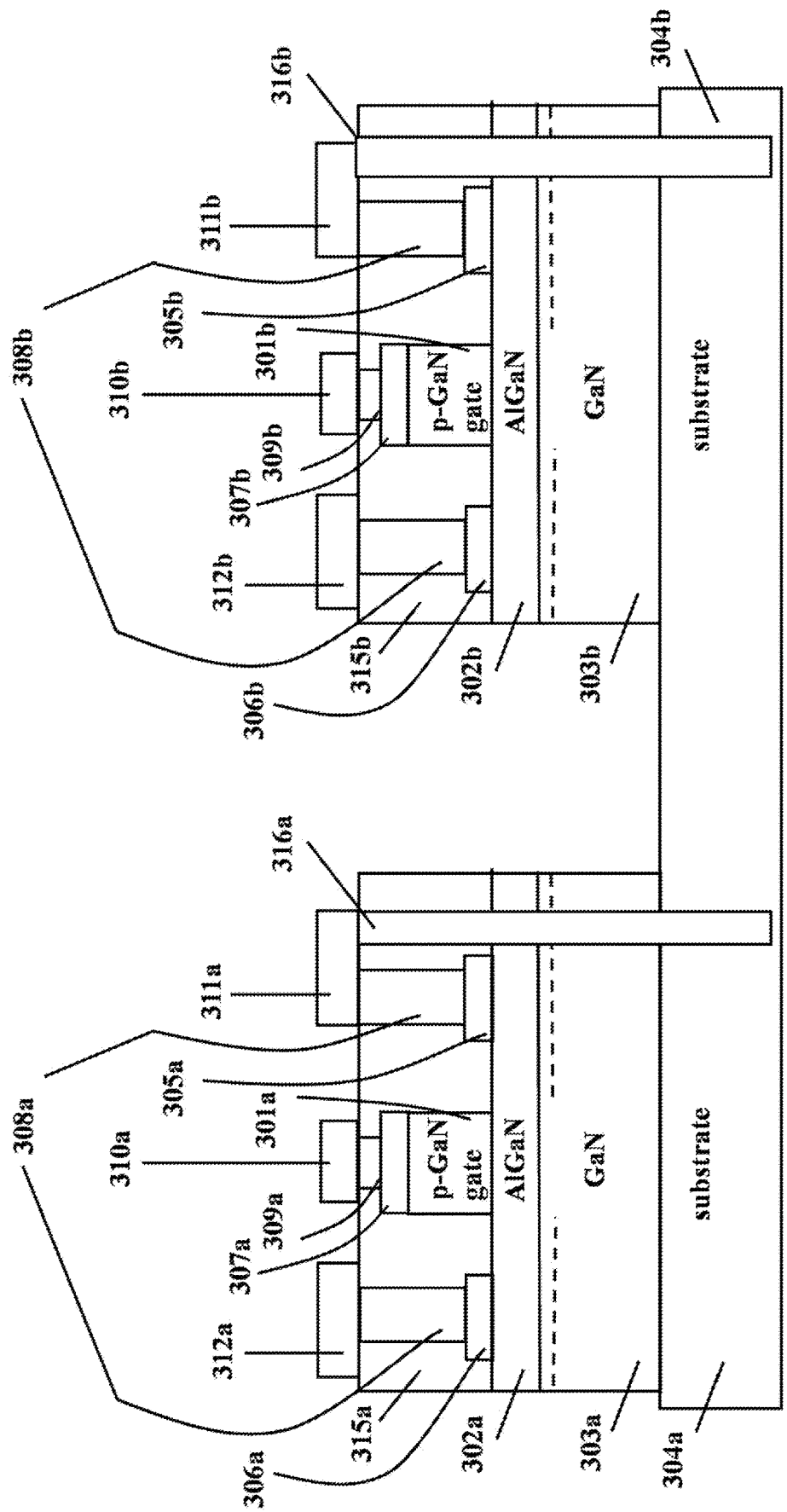
FIG. 19 shows a schematic cross-sectional view of a metal connection structure for forming a drain electrode and a drain-to-substrate contact via by using a photomask and a metal deposition processes according to a preferred embodiment of the present invention.

Utilizing photomask process and metal deposition process to form drain contact metals (311a, 311b), which connect the drain electrodes (305a, 305b) and metal that fills the deep etching vias (316a, 316b) of individual transistor (HEMT) to form metal contacts between the drain electrodes (305a, 305b) and the deep etching vias (316a, 316b), the structure is shown in FIG. 19.

Figure 20:
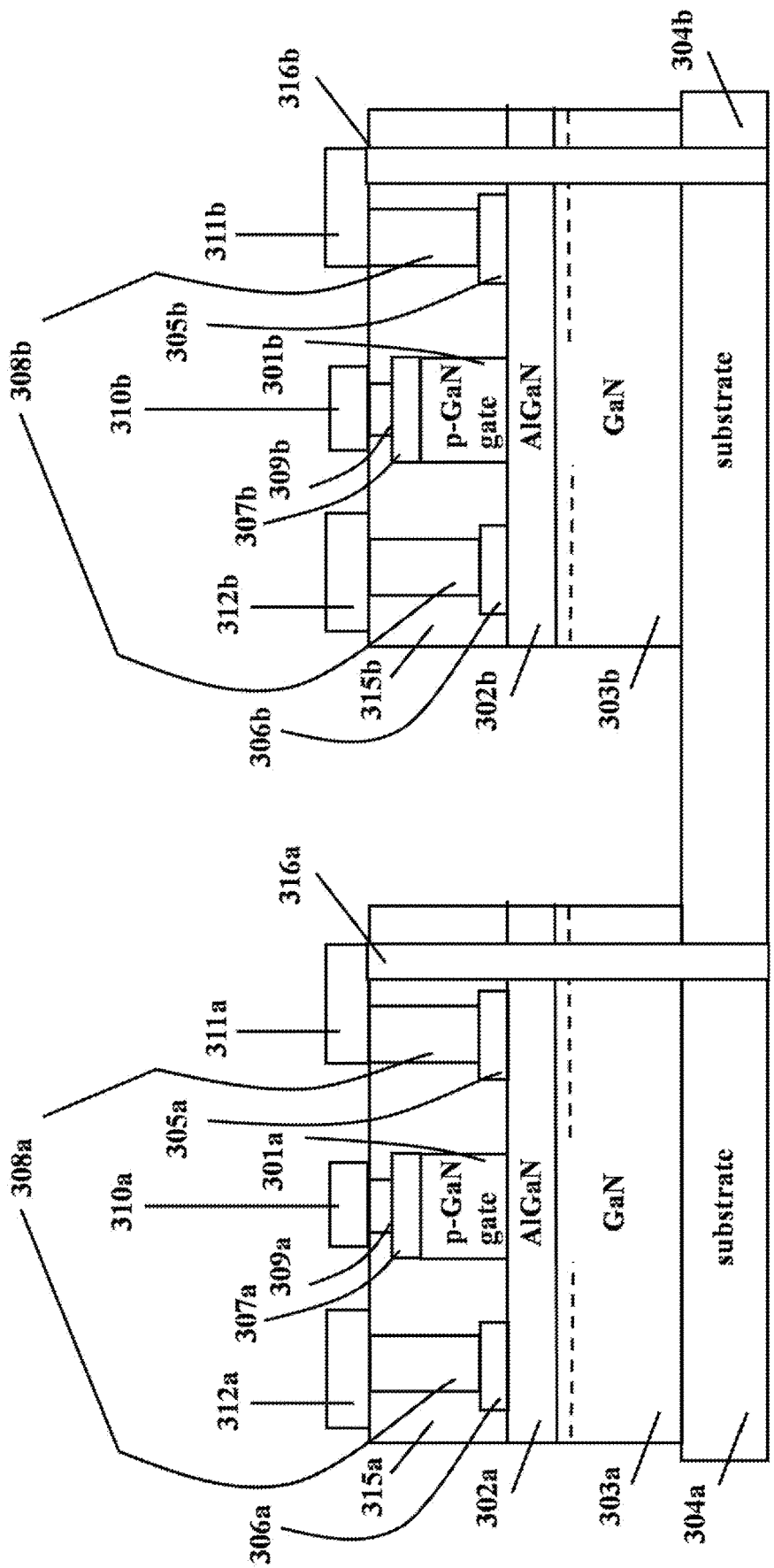
FIG. 20 shows a schematic cross-sectional view of a structure in which a backside polishing process of a wafer is performed so that the filling metal in the contact vias from the drain electrode to the substrate is exposed to the backside of the substrate according to a preferred embodiment of the present invention.

Next, on the backside of the wafer, backside polishing process of the substrates (304a, 304b) is performed to expose metal contacts that have been filled with metal in the deep etching contact vias (316a, 316b) to the backside of the substrates (304a, 304b), the structure is shown in FIG. 20. According to one embodiment of the present invention, the backside polishing process of the wafer, i.e. the substrate (304a, 304b) polishing process, where the substrate can be polished and thinned, completely removed by polishing, or can be removed by laser lift-off (LLO) process.

Figure 21:
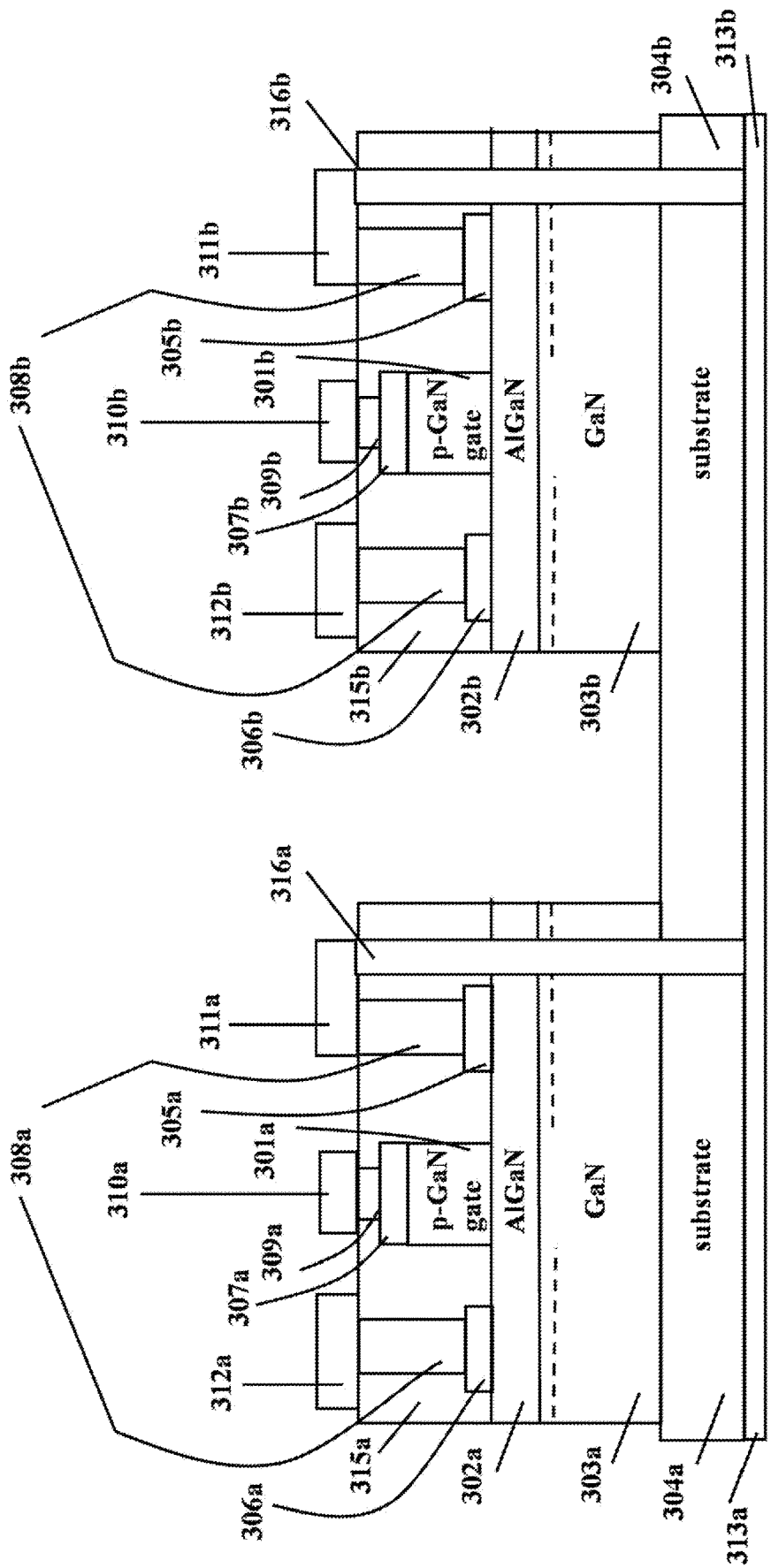
FIG. 21 shows a schematic cross-sectional view of a back electrode structure formed by metal deposition according to a preferred embodiment of the present invention.

Next, metal deposition is utilized to form back electrodes (313a, 313b), and the structure is shown in FIG. 21.

Figure 22:
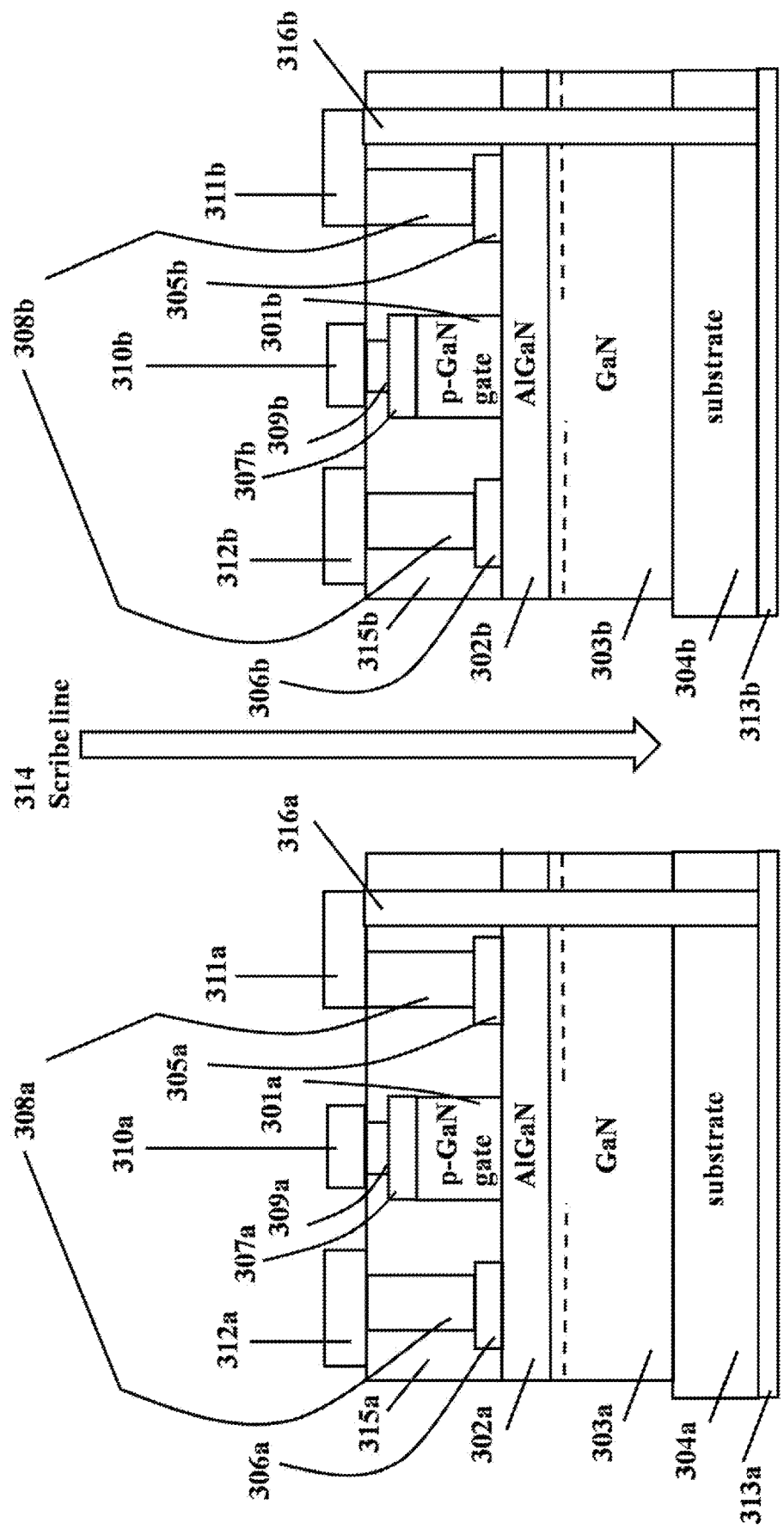
FIG. 22 shows a schematic cross-sectional view of performing a wafer dicing to form a normally-off GaN-based HEMT structure according to a preferred embodiment of the present invention.

Next, the wafer are diced between substrates (304a, 304b) along the dicing direction 314 to form normally-off GaN-based HEMTs as shown in FIG. 22.

Another embodiment of the present invention provides a process integration method for fabricating normally-on GaN-based HEMTs with electrodes of each transistor connected to its back electrode. Similar to FIG. 10, a multi-layer epitaxial structure is prepared first, the multi-layer epitaxial structure from top to bottom includes a n-type Aluminum Gallium Nitride (AlGaN) layer (302a, 302b), a n-type Gallium Nitride (GaN) layer (303a, 303b) and a substrate (304a, 304b).

Compared to the normally-off GaN-based HEMT structure, the normally-on GaN-based HEMT does not have a p-type GaN gate layer, and the gate metal is directly formed on the AlGaN layer. The remaining integrated process for forming normally-on GaN-based HEMTs can be simplified as forming drain electrode, source electrode and gate electrode directly on the AlGaN layer; then forming a protective layer over the AlGaN layer, the drain electrode, the source electrode and the gate electrode; forming drain and source contact vias, and gate contact vias in the protective layer by etching; then, forming deep etching contact vias that penetrate the protective layer, AlGaN layer, n-type gallium nitride (GaN) layer and deep into the substrate by deep etching process to act as deep etching contact vias from the drain to the substrate, and then filling the drain and source contact vias, gate contact vias, and drain-to-substrate deep etching contact vias with metal by metal deposition; forming source and gate metal bonding regions (PADs) by metal deposition; and forming drain contact metals, which connect the drain electrode and metal that fills the deep etching vias of individual transistor (HEMT) to form metal contacts between the drain electrode and the deep etching vias; performing wafer backside polishing process to expose metal contacts that fill in the deep etching contact vias to the backside of the substrates; forming back electrode by metal deposition; forming normally-on GaN-based HEMTs by dicing the wafer between the substrates along the dicing direction.

Compared with the prior art, the integration process that connect electrode(s) of the individual normally-off or normally-on GaN-based HEMTs to the back electrode by a deep etching process can not only reduce the layout area, but also reduce the parasitic effect due to the device package, and also make the wiring of the components easier in the package process. Such a reduction in the layout area can reduce the cost per wafer. In addition, after the electrodes of each HEMT are connected to the back electrode, conductive glue can be used to connect to the packaging frame during packaging process, which can not only reduce the parasitic effect of the packaging, but also reduce the number of wires and reduce the packaging cost. The above advantages cannot be achieved by the prior art.

While various embodiments of the present invention have been described above, it should be understood that they have been presented by a way of example and not limitation. Numerous modifications and variations within the scope of the invention are possible. The present invention should only be defined in accordance with the following claims and their equivalents.

What is claimed is:

1. A Gallium Nitride (GaN)-based high electron mobility transistor (HEMT) comprising:
   a substrate;
   from bottom to top, a n-type Gallium Nitride (GaN) layer, an Aluminum Gallium Nitride (AlGaN) layer and a p-type Gallium Nitride (GaN) layer been formed on one side of said substrate, wherein said n-type GaN layer is used to generate a two-dimensional electron gas therein and used as a channel layer, said p-type GaN layer and said n-type GaN layer form a pn junction to deplete said two-dimensional electron gas in said channel layer;
   a backside electrode been formed on other side of said substrate;
   a source electrode been formed on said AlGaN layer and making ohmic contact with said AlGaN layer;
   a drain electrode been formed on said AlGaN layer not overlapping said source electrode and making ohmic contact with said AlGaN layer; and
   a gate electrode been formed on said p-type GaN layer not overlapping said source electrode and said drain electrode;
   a protective layer been formed over said AlGaN layer, said source electrode, said drain electrode and said gate electrode;
   a plurality of vias been formed in said protective layer to respectively connect said source electrode, said drain electrode and said gate electrode to outside of said protective layer through metal connection; and
   a contact via been formed between said outside of said protective layer and said backside electrode, and penetrating through said protective layer, said AlGaN layer, said n-type GaN layer and said substrate to electrically connect one or more electrodes of said source electrode, said drain electrode and said gate electrode to said backside electrode through metal contact.

2. The GaN-based HEMT of claim 1, wherein material of said substrate includes group consisting of Aluminum Oxide ($Al_2O_3$), Silicon Carbide (SiC), Zinc Oxide (ZnO), Silicon substrate (Si), Gallium Nitride (GaN), Aluminum Gallium Nitride ($Al_xGa_{1-x}N$), Indium Gallium Nitride ($In_xGa_{1-x}N$) and Aluminum Indium Gallium Nitride ($In_xAl_yGa_{1-x-y}N$), where x, y are the contents ($0 \le x \le 1$, $0 \le y \le 1$).

3. The GaN-based HEMT of claim 1, wherein materials for making said gate electrode, said source electrode and said drain electrode include Au, Pt/Ti/Pt/Au, Ti/Al/Ti/Au, Ti/Au, Cr/Au, Pd/Au, Ti/Pd/Au Pd/Ti/Au, Cr, Pt/Au, Ni/Au, Ta/Ti, Ti/Pt/Au, Ti/Cr/Au, W/Au, W/Cu, Cu or Pt/Ru.

4. The GaN-based HEMT of claim 1, wherein materials for making said metal connection include Au, Pt/Ti/Pt/Au, Ti/Al/Ti/Au, Ti/Au, Cr/Au, Pd/Au, Ti/Pd/Au Pd/Ti/Au, Cr, Pt/Au, Ni/Au, Ta/Ti, Ti/Pt/Au, Ti/Cr/Au, W/Au, W/Cu, Cu or Pt/Ru.

5. The GaN-based HEMT of claim 1, wherein said other side of said substrate is polished and thinned by a backside polishing process to expose metal contact that filled said contact via before formation of said backside electrode.

6. The GaN-based HEMT of claim 1, wherein said n-type GaN layer, said p-type GaN layer and said AlGaN layer are formed by molecular beam epitaxy (MBE) or metalorganic vapor phase epitaxy (MOVPE).

7. A Gallium Nitride (GaN)-based high electron mobility transistor (HEMT) comprising:
a n-type Gallium Nitride (GaN) layer;
an Aluminum Gallium Nitride (AlGaN) layer been formed on one side of said n-type GaN layer; and
a p-type Gallium Nitride (GaN) layer been formed on said AlGaN layer, wherein said n-type GaN layer is used to generate a two-dimensional electron gas therein and used as a channel layer, said p-type GaN layer and said n-type GaN layer form a pn junction to deplete said two-dimensional electron gas in said channel layer;
a backside electrode been formed on other side of said n-type GaN layer;
a source electrode been formed on said AlGaN layer and making ohmic contact with said AlGaN layer;
a drain electrode been formed on said AlGaN layer not overlapping said source electrode and making ohmic contact with said AlGaN layer; and
a gate electrode been formed on said p-type GaN layer not overlapping said source electrode and said drain electrode;
a protective layer been formed over said AlGaN layer, said source electrode, said drain electrode and said gate electrode;
a plurality of vias been formed in said protective layer to respectively connect said source electrode, said drain electrode and said gate electrode to outside of said protective layer through metal connection; and
a contact via been formed between said outside of said protective layer and said backside electrode, and penetrating through said protective layer, said AlGaN layer and said n-type GaN layer to electrically connect one or more electrodes of said source electrode, said drain electrode and said gate electrode to said backside electrode through metal contact.

8. The GaN-based HEMT of claim 7, wherein materials for making said gate electrode, said source electrode and said drain electrode include Au, Pt/Ti/Pt/Au, Ti/Al/Ti/Au, Ti/Au, Cr/Au, Pd/Au, Ti/Pd/Au Pd/Ti/Au, Cr, Pt/Au, Ni/Au, Ta/Ti, Ti/Pt/Au, Ti/Cr/Au, W/Au, W/Cu, Cu or Pt/Ru.

9. The GaN-based HEMT of claim 7, wherein materials for making said metal connection include Au, Pt/Ti/Pt/Au, Ti/Al/Ti/Au, Ti/Au, Cr/Au, Pd/Au, Ti/Pd/Au Pd/Ti/Au, Cr, Pt/Au, Ni/Au, Ta/Ti, Ti/Pt/Au, Ti/Cr/Au, W/Au, W/Cu, Cu or Pt/Ru.

10. The GaN-based HEMT of claim 7, wherein said n-type GaN layer, said p-type GaN layer and said AlGaN layer are formed by molecular beam epitaxy (MBE) or metalorganic vapor phase epitaxy (MOVPE).

11. A Gallium Nitride (GaN)-based high electron mobility transistor (HEMT) comprising:
a substrate;
from bottom to top, a n-type Gallium Nitride (GaN) layer and an Aluminum Gallium Nitride (AlGaN) layer been formed on one side of said substrate, wherein said n-type GaN layer is used to generate a two-dimensional electron gas therein and used as a channel layer;
a backside electrode been formed on other side of said substrate;
a source electrode been formed on said AlGaN layer and making ohmic contact with said AlGaN layer;
a drain electrode been formed on said AlGaN layer not overlapping said source electrode and making ohmic contact with said AlGaN layer; and
a gate electrode been formed on said AlGaN layer not overlapping said source electrode and said drain electrode;
a protective layer been formed over said AlGaN layer, said source electrode, said drain electrode and said gate electrode;
a plurality of vias been formed in said protective layer to respectively connect said source electrode, said drain electrode and said gate electrode to outside of said protective layer through metal connection; and
a contact via been formed between said outside of said protective layer and said backside electrode, and penetrating through said protective layer, said AlGaN layer, said n-type GaN layer and said substrate to electrically connect one or more electrodes of said source electrode, said drain electrode and said gate electrode to said backside electrode through metal contact.

12. The GaN-based HEMT of claim 11, wherein material of said substrate includes group consisting of Aluminum Oxide ($Al_2O_3$), Silicon Carbide (SiC), Zinc Oxide (ZnO), Silicon substrate (Si), Gallium Nitride (GaN), Aluminum Gallium Nitride ($Al_xGa_{1-x}N$), Indium Gallium Nitride ($In_xGa_{1-x}N$) and Aluminum Indium Gallium Nitride ($In_xAl_yGa_{1-x-y}N$), where x, y are the contents ($0 \leq x \leq 1$, $0 \leq y \leq 1$).

13. The GaN-based HEMT of claim 11, wherein materials for making said gate electrode, said source electrode and said drain electrode include Au, Pt/Ti/Pt/Au, Ti/Al/Ti/Au, Ti/Au, Cr/Au, Pd/Au, Ti/Pd/Au Pd/Ti/Au, Cr, Pt/Au, Ni/Au, Ta/Ti, Ti/Pt/Au, Ti/Cr/Au, W/Au, W/Cu, Cu or Pt/Ru.

14. The GaN-based HEMT of claim 11, wherein materials for making said metal connection include Au, Pt/Ti/Pt/Au, Ti/Al/Ti/Au, Ti/Au, Cr/Au, Pd/Au, Ti/Pd/Au Pd/Ti/Au, Cr, Pt/Au, Ni/Au, Ta/Ti, Ti/Pt/Au, Ti/Cr/Au, W/Au, W/Cu, Cu or Pt/Ru.

15. The GaN-based HEMT of claim 11, wherein said n-type GaN layer and said AlGaN layer are formed by molecular beam epitaxy (MBE) or metalorganic vapor phase epitaxy (MOVPE).

16. The GaN-based HEMT of claim 11, wherein said other side of said substrate is polished and thinned by a backside polishing process to expose metal contact that filled said contact via before formation of said backside electrode.

* * * * *